US008193598B2

(12) United States Patent
Eshaghian-Wilner et al.

(10) Patent No.: US 8,193,598 B2
(45) Date of Patent: Jun. 5, 2012

(54) SPIN-WAVE ARCHITECTURES

(75) Inventors: Mary M. Eshaghian-Wilner, Los Angeles, CA (US); Alexander Khitun, Los Angeles, CA (US); Kang L. Wang, Santa Monica, CA (US)

(73) Assignee: The Regents of the University of California, Oakland, CA (US)

( * ) Notice: Subject to any disclaimer, the term of this patent is extended or adjusted under 35 U.S.C. 154(b) by 813 days.

(21) Appl. No.: 12/264,560

(22) Filed: Nov. 4, 2008

(65) Prior Publication Data

US 2009/0096044 A1    Apr. 16, 2009

Related U.S. Application Data

(63) Continuation of application No. 11/668,896, filed on Jan. 30, 2007, now Pat. No. 7,535,070.

(60) Provisional application No. 60/763,244, filed on Jan. 30, 2006, provisional application No. 60/800,229, filed on May 11, 2006.

(51) Int. Cl.
    *H01L 45/02* (2006.01)
(52) U.S. Cl. ......... 257/427; 257/E29.323; 257/E43.001; 257/E45.006; 977/933
(58) Field of Classification Search .................. 257/421, 257/427, E29.323, E43.001, E45.006; 977/933
    See application file for complete search history.

(56) References Cited

U.S. PATENT DOCUMENTS

| 4,679,012 | A | 7/1987 | Buck |
| 6,774,391 | B1 | 8/2004 | Cowburn |
| 6,867,988 | B2 | 3/2005 | Cowburn |
| 7,212,026 | B2 | 5/2007 | Bourianoff et al. |
| 7,535,070 | B2 * | 5/2009 | Eshaghian-Wilner et al. ................. 257/421 |
| 2007/0259209 | A1 | 11/2007 | Slavin et al. |
| 2008/0231392 | A1 | 9/2008 | Kim et al. |

FOREIGN PATENT DOCUMENTS

| JP | 2005181071 A | 7/2005 |
| WO | WO 2007037625 A1 | 4/2007 |

OTHER PUBLICATIONS

Alnuweiri; "Constant-Time Parallel Algorithms for Image Labeling on a Reconfigurable Network of Processors"; IEEE Transactions on Parallel and Distributed Systems; vol. 5; No. 3; Mar. 1994; pp. 320-326.
Avouris, et al.; "Carbon Nanotube Electronics"; Proceedings of the IEEE; vol. 91; No. 11; Nov. 2003; pp. 1772-1784.
Awschalom, et al.; "Spintronics"; Scientific American; Jun. 2002; pp. 67-73.

(Continued)

*Primary Examiner* — Anh Phung
*Assistant Examiner* — Michael Lulis
(74) *Attorney, Agent, or Firm* — Ballard Spahr LLP

(57) ABSTRACT

Nano-scale and multi-scale computational architectures using spin waves as a physical mechanism for device interconnection are provided. Solid-state spin-wave computing devices using nano-scale and multi-scale computational architectures comprised of a plurality of inputs and a plurality of outputs are described where such devices are configured to simultaneously transmit data elements from the inputs to the outputs by using spin-waves of differing frequencies. These devices include but are not limited to a spin-wave crossbar, a spin-wave reconfigurable mesh, a spin-wave fully-interconnected cluster, a hierarchical multi-scale spin-wave crossbar, a hierarchical multi-scale spin-wave reconfigurable mesh and a hierarchical multi-scale spin-wave fully-interconnected cluster.

22 Claims, 14 Drawing Sheets

OTHER PUBLICATIONS

Balasingam, et al.; "Nanoelectronic Functional Devices"; Purdue University Technical Report: TR-EE; Jul. 1994; pp. 1-53.

Bhagavathi, et al.; "Time-Optimal Visibility-related Algorithms on Meshes with Multiple Broadcasting"; IEEE Transactions on Parallel and Distributed Systems; vol. 6; No. 7; Jul. 1995; pp. 687-703.

Chin, et al.; "The Princeton Engine: A Real-time Video System Simulator"; IEEE Transactions on Consumer Electronics; Mar. 17, 1988; pp. 285-297.

Chuang, et al.; "Quantum-Well Assisted Tunneling Injection Quantum-Dot Lasers"; Lasers and Electro-Optics Technical Digest; vol. 1; 2002; pp. 297.

Collins, et al.; "Engineering Carbon Nanotubes and Nanotube Circuits Using Electrical Breakdown"; Science; vol. 292; No. 5517; Apr. 27, 2001; pp. 706-709.

Covington, et al.; "Time-Resolved Measurement of Propagating Spin-Waves In Ferromagnetic Thin Films"; Physical Review Letters; vol. 89; No. 23; Dec. 2, 2002; pp. 237202-1-237202-4.

Cypher, et al.; "EREW PRAM and Mesh Connected Computer Algorithms for Image Component Labeling"; Proceeding of IEEE Computer Society Workshop on Computer Architecture for Pattern Analysis and Machine Intelligence; 1987; pp. 122-128.

Datta, et al.; "Electronic Analog of the Electro-Optic Modulator"; Applied Physics Letters; vol. 56; No. 7; Feb. 12, 1990; pp. 665-667.

Dehon; "Array-Based Architecture for FET-Based, Nanoscale Electronics"; IEEE Transactions on Nanotechnology; vol. 2; No. 1; Mar. 1, 2003; pp. 23-32.

Elliott, et al.; "Beamwidth and Directivity of Large Scanning Arrays"; Significant Phased Array Papers, Array Analysis and Synthesis; 1973; pp. 1-66.

Eshaghian, et al; "An Optically Interconnected Reconfigurable Mesh"; Journal of Parallel and Distributed Computing; vol. 61, No. 6; Jun. 2001; pp. 737-747.

Eshaghian-Wilner et al.; "A Glance at VLSI Optical Interconnects: From the Abstract Modelings of the 1980s to Today's MEMS Implementations"; Handbook on Innovative Computing; 2006; pp. 315-341.

Eshaghian-Wilner, et al.; "A Nano-Scale Crossbar with Spin-Waves"; The 6th IEEE Conference on Nanotechnology; Jul. 2006; pp. 1-4.

Eshaghian-Wilner, et al.; "A Nano-Scale Module with Full Spin-Wave Interconnectivity for Integrated Circuits"; the NSTI Nanotech 2006; May 2006; pp. 1-4.

Eshaghian-Wilner, et al.; "A Nano-Scale Reconfigurable Mesh with Spin Waves"; The ACM International Conference on Computing Frontiers; May 2006; pp. 65-69.

Eshaghian-Wilner, et al.; "Implementation and Application of a Gated Connection Network in Image Understanding Architecture," appeared as a chapter in the edited volume entitled "Reconfigurable Massively Parallel Computers," by H. Li and Q. Stout, Prentice Hall, 1991.

Eshaghian-Wilner, et al.; "Molecular and Nanoscale Computing and Technology"; "Handbook entitled Innovative Computing"; 2006; pp. 477-510.

Eshaghian-Wilner, et al.; "The Systolic Reconfigurable Mesh"; Journal of Parallel Processing Letters; vol. 14; No. 3 and 4; Jun. 2004; pp. 337-350.

Eshaghian-Wilner, et al.; "A Nano-scale Architecture for Constant Time Image Processing"; Department of Electrical Engineering UCLA; Sep. 2006; pp. 1-6.

Eshaghian-Wilner, et al.; "Hierarchical Multi-scale Architectures with Spin Waves"; Proceedings of the 2006 International Conference on Computing in Nanotechnology at WORLDCOMP'06; Jun. 26-29, 2006; pp. 1-7.

Eshaghian-Wilner, et al.; "The Spin-wave Nano-Scale Reconfigurable Mesh and the Labeling Problem"; Transaction on Emerging Technology; 2006; pp. 1-19.

Eshaghian-Wilner; "Parallel Algorithms for Image Processing on OMC"; IEEE Transactions on Computers; vol. 40; No. 7; Jul. 1991; pp. 827-833.

Eshaghian-Wilner; "The Architectural Designs of a Nanoscale Computing Model"; Journal of Systemics, Cybernetics, and Informatics; vol. 2; No. 4; 2004; pp. 1-4.

Fortes, et al.; "Nanoelectronic Adaptive Systems"; GOMACTech-2003; Mar. 31-Apr. 3, 2003; pp. 1-5.

Fountain, et al.; "The CLIP7A Image Processor"; IEEE Transactions on Pattern Analysis and Machine Intelligence; vol. 10; No. 3; May 3, 1988; pp. 310-319.

Fu, et al.; "CLIP4"; Special Computer Architectures for Pattern Processing; 1982; pp. 65-86.

Goldhaber-Gordon, et al; "Overview of Nanoelectronic Devices"; Proceedings of IEEE; vol. 85; No. 4; Apr. 4, 1997; pp. 521-540.

Goodman, et al; "Optical Interconnections for VLSI Systems"; Proceedings of the IEEE; vol. 72; No. 7; Jul. 1984; pp. 850-866.

Goodwin; "Towards an Optical Computer"; Engineering; Oct. 17, 1969; pp. 423-424.

Hai; "Efficient Parallel Processing With Optical Interconnections"; New Jersey Institute of Technology; May 1997; pp. 1-90.

Hammerstrom, et al.; "Image Processing Using One-dimensional Processor Arrays"; IEEE Proceedings; vol. 84; No. 7; Jul. 7, 1996; pp. 1005-1018.

Harder, et al.; "On Wavelength Assignment in WDM Optical Networks"; International Conference Massively Parallel Processing Using Optical Interconnections; Jun. 22-24, 1997; pp. 32-38.

Heath, et al.; "Molecular Electronics"; American Institute of Physics; May 2003; pp. 43-49.

Herbordt, et al.; "Non-Uniform Region Processing on SIMD Arrays Using the Coterie Network"; Machine Vision and Applications; vol. 5; No. 2; 1992; pp. 105-125.

Hiebert et al.; "Direct Observation of Magnetic Relaxation in a Small Permalloy Disk by Time-Resolved Scanning Kerr Microscopy"; Physical Review Letters; vol. 79; No. 6; Aug. 11, 1997; pp. 1134-1137.

Hinton; "Architectural Considerations for Photonic Switching Networks"; IEEE Journal on Selected Areas in Communications; vol. 6; No. 7; Aug. 1988; pp. 1209-1226.

James, et al.; "Organic Synthesis and Device Testing for Molecular Electronics"; Aldrichimica Acta ; vol. 39; No. 2; 2006; pp. 47-56.

Jang, et al.; "A Fast Algorithm for Computing a Histogram on Reconfigurable Mesh"; IEEE Transactions on Pattern Analysis and Machine Intelligence; vol. 17; No. 2; Feb. 1995; pp. 97-106.

Jenq, et al.; "Histogramming on a Reconfigurable Mesh Computer"; Proceedings of the 6th International Parallel Processing Symposium; Mar. 23-26, 1992; pp. 425-432.

Ji, et al.; "Electromagnetic Micromirror Array with Single-Crystal Silicon Mirror Plate and Aluminum Spring"; Journal of Lightwave Technology; vol. 21; No. 3; Mar. 3, 2003; pp. 584-590.

Kalinikos, et al; "Parametric Frequency Conversion with Amplification of a Weak Spin-Wave in a Ferrite Film"; IEEE Transactions on Magnetics; vol. 34; No. 4; Jul. 4, 1998; pp. 1393-1395.

Khitun, et al.; "Nano Scale Computational Architectures With Spinwave Bus"; Superlattices & Microstructures 38; Sep. 2005; pp. 184-200.

Khitun, et al.; Feasibility Study of the Spin-Wave Quantum Network.; International Symposium on Nanostructures; vol. 5023; 2003; pp. 449-451.

Khitun, et al.; "Inductively Coupled Circuits With Magnetic Bus for Information Processing"; Device Research Laboratory; Electrical Engineering Department; 2006; pp. 1-31.

Khitun, et al.; "Spin-Wave Utilization in a Quantum Computer"; Physical Review A; vol. 64; Dec. 2001; pp. 062304-1-062304-5.

Kim, et al.; "Single-Electron Transistor Based on a Silicon-on-Insulator Quantum Wire Fabricated by a Side-Wall Patterning Method"; Appl. Phys. Lett.; vol. 79; No. 23; 2001; pp. 3812-3814.

Kostylev et al., "Spin-wave logical gates", Appl. Phys. Lett. 87, 153501 (2005).

Kumar, et al.; "Parallel Geometric Algorithms for Digitized Pictures on Mesh of Trees"; In Proc. of IEEE International Conference on Parallel Processing; 1986; pp. 270-273.

Lent, et al; "Reversible Computation With Quantum-Dot Cellular Automata (QCA)"; Computing Frontiers Conference; May 4-6, 2005; pp. 403.

Leonard, et al.; "Negative Differential Resistance in Nanotube Devices"; Physical Review Letters; vol. 85; No. 22; 2000; 476-4770.

Lewin; "DNA Computing"; Computing in Science & Engineering; vol. 4; No. 3; May-Jun. 2002; pp. 5-8.

Luo, et al.; "Two-Dimensional Molecular Electronics Circuits"; ChemPhysChem; No. 3; 2002; pp. 519-525.

Mehta; "Storage Area Networks and Interoperability"; ISRC Technology Brief; Apr. 14, 2003; pp. 1-16.

Miller, et al.; "Portable Parallel Algorithms for Geometric Problems"; Proceedings of 2nd Symposium on the Frontiers of Massively Parallel Computation; Oct. 1988; pp. 195-198.

Miller, et al.; "Geometric Algorithms for Digitized Pictures on a Mesh-connected Computer"; IEEE Transaction on Pattern Analysis and Machine Intelligence; vol. PAMI-7; No. 2; Mar. 1985; pp. 216-228.

Miller, et al.; "Meshes with Reconfigurable Buses"; Proceedings of the 5 MIT Conference; Mar. 1988; pp. 163-178.

Miller, et al.; "Parallel Computations on Reconfigurable Meshes"; IEEE Transactions on Computers; vol. 42; No. 6; Jun. 1993; pp. 678-692.

Nojeh, et al; "Electric-Field-Directed Growth of Carbon Nanotubes in Two Dimensions"; J. Vac. Sci. Technol. B 22(6); Nov./Dec. 2004; pp. 3421-3425.

Ohno et al.; "Electrical Spin Injection in a Ferromagnetic Semiconductor Heterostructure"; Nature; vol. 402; No. 6763; Dec. 16, 1999; pp. 790-792.

Ono, et al.; "Single-Electron Pass-Transistor Logic: Operation of Its Elemental Circuit"; International Electron Devices Meeting; Dec. 10-13, 2000; pp. 297-300.

Phillips, et al.; "Room Temperature Self-Organized Quantum Dot Transistors"; 56th Annual Device Research Conference Digest; Jun. 1998; pp. 46-47.

Ratner, et al; "Molecular Electronics: Some Directions"; International Union of Pure and Applied Chemistry; 1997; pp. 5-72.

Reif, et al.; "Parallel Biomolecular Computation: Models and Simulations"; Algorithmica; An international journal in computer science; vol. 25; No. 1; Sep. 1999; pp. 142-175.

Roska; "Analogic Wave Computers-Wave-Type Algorithms: Canonical Description, Computer Classes, and Computational Complexity"; The 2001 IEEE International Symposium on Circuits and Systems (Cat. No. 01CH37196). IEEE. Part; vol. 2; May 6-9, 2001; pp. 41-44.

Seabaugh, et al.; "Tunnel Diodes"; Beyond-the-roadmap Technology: Silicon Heterojunctions, Optoelectronics, and Quantum Devices; Encyclopedia of Physics; vol. 22; 1998; pp. 335-359.

Silva, et al.; "Inductive Measurement of Ultrafast Magnetization Dynamics in Thin-Film Permalloy"; Journal of Applied Physics; vol. 85; No. 11; Jun. 1, 1999; pp. 7849-7862.

Snider, et al.; "Quantum-Dot Cellular Automata"; Journal of Applied Physics; vol. 85; No. 8; Apr. 15, 1999; pp. 4283-4285.

Strukov, et al.; "CMOL FPGA: A Reconfigurable Architecture for Hybrid Digital Circuits With Two-Terminal Nanodevices"; Institute of Physics Publishing; Nanotechnology 16; 2005; pp. 888-900.

Sun, et al.; "Resonant Tunneling Diodes: Models and Properties"; Proceedings of IEEE; vol. 86; No. 4; Apr. 4, 1998; pp. 641-661.

Tans, et al.; "Room Temperature Transistor Based on a Single Carbon Nanotube"; Nature; vol. 393; May 7, 1998; pp. 49-52.

Weem, et al.; "The Image Understanding Architecture"; Computer and Information Science; 1987; pp. 1-45.

Wu et al., "Self-Generation of Chaotic Solitary Spin Wave Pulses in Magnetic Film Active Feedback Rings", Phys. Rev. Lett. 95, 237202 (2005).

Wu, et al.; "Generation of Dark and Bright Spin Wave Envelope Solution Trains Through Self-Modulational Instability in Magnetic Films"; The American Physical Society; Physical Review Letters; vol. 93; No. 15; Oct. 8, 2004; pp. 157207-1-157207-4.

Yano, et al.; "Single-Electron Memory for Giga-To-Tera Bit Storage"; Proceedings of IEEE; vol. 87; No. 4; Apr. 4, 1999; pp. 633-651.

* cited by examiner

| NOT | | | |
|---|---|---|---|
| PHYSICAL PARAMETERS | | LOGIC STATES $V_{ref}$ = 0 V | |
| EXCITATION PULSE | MEASURED VOLTAGE | INPUT | OUTPUT |
| +10 V | -15 mV | 1 | 0 |
| -10 V | +15 mV | 0 | 1 |

| AND | | | |
|---|---|---|---|
| PHYSICAL PARAMETERS | | LOGIC STATES $V_{ref}$ = 10 mV | |
| EXCITATION PULSES | MEASURED VOLTAGE | INPUT | OUTPUT |
| +10 V  +10 V | +27 mV | 1  1 | 1 |
| +10 V  -10 V | 0 mV | 1  0 | 0 |
| -10 V  +10 V | 0 mV | 0  1 | 0 |
| -10 V  -10 V | -27 mV | 0  0 | 0 |

| OR | | | |
|---|---|---|---|
| PHYSICAL PARAMETERS | | LOGIC STATES $V_{ref}$ = -10 mV | |
| EXCITATION PULSES | MEASURED VOLTAGE | INPUT | OUTPUT |
| +10 V  +10 V | +27 mV | 1  1 | 1 |
| +10 V  -10 V | 0 mV | 1  0 | 1 |
| -10 V  +10 V | 0 mV | 0  1 | 1 |
| -10 V  -10 V | -27 mV | 0  0 | 0 |

SPIN-WAVE ARCHITECTURES

CROSS REFERENCE TO RELATED APPLICATIONS

This application is a continuation application of U.S. patent application Ser. No. 11/668,896, filed Jan. 30, 2007 now U.S. Pat. No. 7,535,070, which claims priority to U.S. Provisional Patent Application Ser. No. 60/763,244 entitled "Methods To Efficiently Interconnect Nanoscale Computational Components With Spin-Waves," which was filed on Jan. 30, 2006, and U.S. Provisional Patent Application with application No. 60/800,229 entitled "Hierarchical Multi-Scale Architectures With Spin-Waves," which was filed on May 11, 2006, all of these applications are hereby incorporated by reference in their entirety.

BACKGROUND

With the considerable technological advances, computing devices have become more common resulting in a sizable increase in use. To address this increased use, there has been a lingering quest to increase the speed and processing power of the transistor-based computational architecture. According to "Moore's law," computing power doubles every 18 months. However, it is widely believed in the semiconductor community that further enhancement of the most elaborate silicon transistor—CMOS, is coming to the end. This end of scaling will be due to several concurrent fundamental and practical limits related to transistor operation and manufacturability. Fundamental limits include sustaining viable transistor operation and limiting thermal dissipation to manageable limits, both of which are common to all charge based logic devices and independent of device structure and material properties.

Utilizing electron spin for information encoding and information transmission creates somewhat a viable solution. Spintronics is a new approach to electronics, where the information is carried out by the spin of the carrier, in addition to the charge. In spin-based semiconductor logic devices, the carrier transport depends on the spin, not the charge, of the carrier. Generally, spintronic architectures operate according to the common scheme: (i) information is stored into the spins as a spin orientation (e.g., along with or opposite to the external magnetic field), (ii) the spins, being attached to carriers, transfer information from one spin-based device to another through a conducting wire, (iii) spin polarization of the transmitted carriers affects the conductance of the recipient device, and (iv) information is read at the output terminal. Although the performance of the spin-based devices might be advantageous, the use of charge transfer for information exchange between the devices significantly limits the performance of the spintronic architecture. Hence, there remains an unmet need in the art.

SUMMARY

Disclosed and described herein are embodiments of devices and architecture for interconnecting nanoscale and micro-scale computational components with spin waves. Embodiments according to the invention make use of technology described in U.S. patent application Ser. No. 11/365,794, entitled "Nano-Scale Computational Architectures With Spin-Wave Bus," (Khitun et al.), which was filed on Mar. 1, 2006 and is hereby incorporated by reference in its entirety.

Embodiments according to the present invention provide solid-state spin-wave computing devices that are comprised of a plurality of inputs and a plurality of outputs. The devices are configured to simultaneously transmit data elements from each of said plurality of inputs to each of said plurality of outputs by using spin-waves of differing frequencies.

In one aspect according to embodiments of the present invention, a spin-wave crossbar is provided for fully interconnecting N inputs to N outputs that is configured to transmit $N^2$ data elements.

In another aspect according to embodiments of the present invention, a spin-wave reconfigurable mesh with spin-wave buses is provided.

In yet another aspect according to embodiments of the present invention, a fully-connected cluster of functional units having spin-wave buses is provided.

In another aspect according to embodiments of the present invention, a multi-scale hierarchical spin-wave crossbar is provided that is comprised of at least an optical reconfigurable mesh (ORM) and a spin-wave crossbar.

In another aspect according to embodiments of the present invention, a multi-scale hierarchical spin-wave reconfigurable mesh is provided that is comprised of at least an ORM and a spin-wave reconfigurable mesh.

In another aspect according to embodiments of the present invention, a multi-scale hierarchical spin-wave fully-interconnected cluster is provided that is comprised of at least an ORM and a spin-wave fully-interconnected cluster.

Additional advantages of the invention will be set forth in part in the description which follows or may be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF DRAWINGS

The accompanying drawings, which are not to scale and are incorporated in and constitute a part of this specification, illustrate embodiments according to the invention and together with the description, serve to explain the principles of the invention.

Figure 1A:
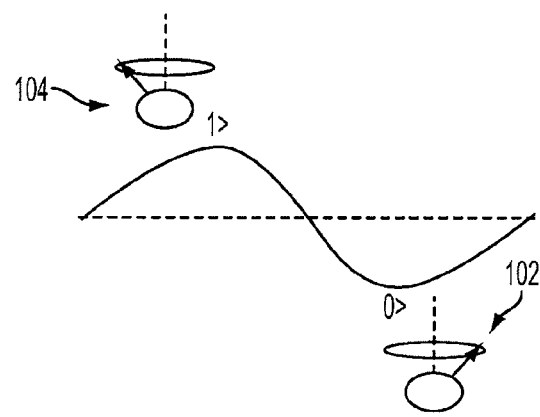
FIG. 1A is a graph illustrating logic states associated with different spins that are encoded in the phase of a signal.

While the invention is susceptible to various modifications and alternative forms, specific embodiments have been shown by way of example in the drawings and subsequently are described in detail. It should be understood, however, that the description herein of specific embodiments is not intended to limit the invention to the particular forms disclosed. In contrast, the intention is to cover all modifications, equivalents, and alternatives falling within the spirit and scope of the invention as defined by the appended claims.

DETAILED DESCRIPTION

Before the present methods and systems are disclosed and described, it is to be understood that this invention is not limited to specific synthetic methods, specific components, or to particular compositions, as such may, of course, vary. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

The present invention may be understood more readily by reference to the following detailed description of preferred embodiments according to the invention and the Examples included therein and to the Figures and their previous and following description.

The invented nano-scale computer architecture with spin wave bus system uses spin waves as a physical mechanism for information transmission among nano-scale devices. A spin wave is a collective oscillation of spins in an ordered spin lattice around the direction of magnetization and is similar to the lattice vibration, where atoms oscillate around their equilibrium position. A propagating spin wave changes the local polarization of spins in a ferromagnetic material (i.e., a material with high magnetic permeability). Examples of ferromagnetic materials include, but are not limited to, iron, nickel, cobalt, and the like. In turn, the changing magnetic field results in an inductive voltage. According to Faraday's law, the magnitude of the inductive voltage is proportional to the speed of the magnetic flux change $$E_{ind} = -\frac{d\Phi_m}{dt}.$$

Figure 1B:
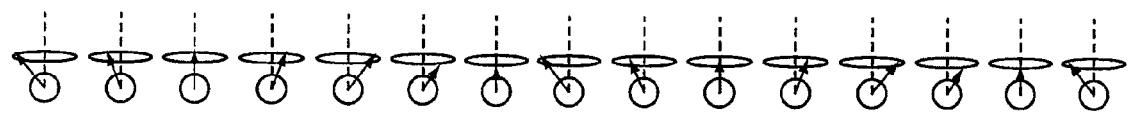
FIG. 1B is an illustration of a collection of spin precessions about a magnetic field that comprise a spin wave according to an embodiment of the present invention.

An inductive voltage signal on the order of several millivolts produced by spin waves can propagate through a nanometer thin ferromagnetic film for distances up to 50 microns at room temperature. Nano-scale architectures use spin waves for coding information into the phase, rather than in the amplitude of the signal. Turning now to FIG. 1A, this figure is a graph illustrating logic states associated with different spins that are encoded in the phase of a signal. For example, the logic state |0> is associated with spin 102, and the logic state |1> is associated with the spin 104. Electron spin produces a magnetic moment and if a magnetic field is applied, then the spin moment will precess about the field. A collection of such spin precessions is a spin wave, as shown in FIG. 1B.

Figure 1C:
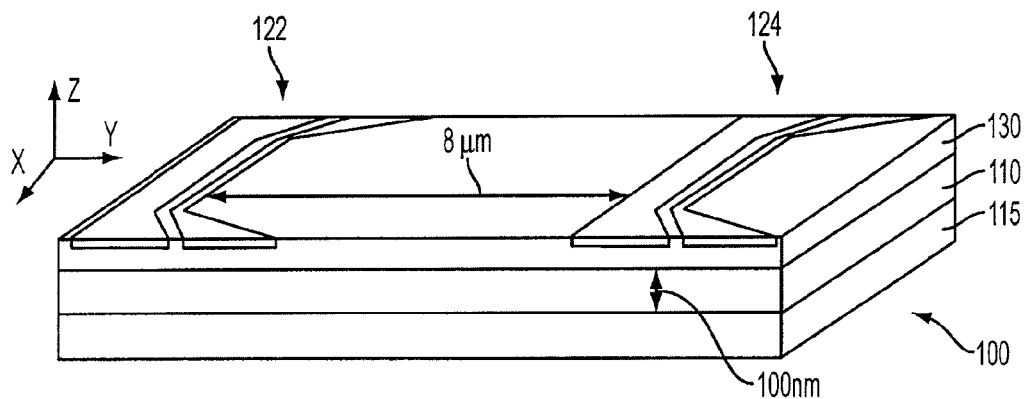
FIG. 1C is a perspective view of an exemplary logic device that includes a spin wave bus made of two transmission lines.
Figure 1D:
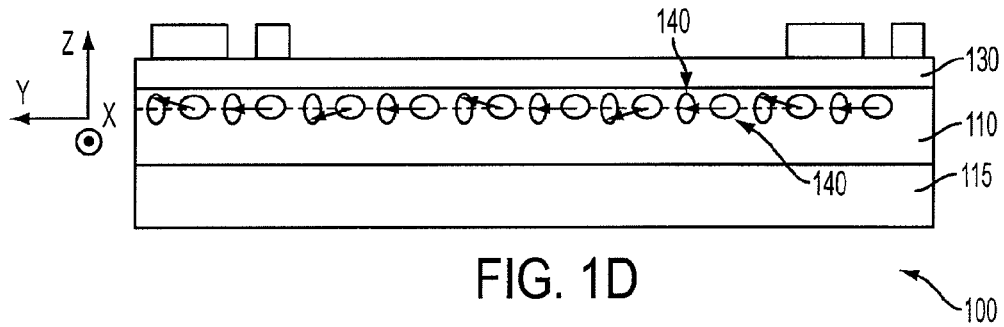
FIG. 1D is a cross-sectional view of the exemplary logic device of FIG. 1C illustrating the creation, propagation, and detection of spin waves in the ferromagnetic film of FIG. 1C.

Turning now to FIGS. 1C and 1D, this is a perspective view of a novel logic device 100 that includes a spin wave bus and two high-frequency transmission lines serving as input/output ports, which are subsequently described. A transmission line is an example of an electronic device suitable for spin wave excitation/detection. Transmission line configuration can be adjusted to meet the impedance match with outer electronic circuits. Though the logic device 100 is shown with two transmission lines, the number of transmission lines can be 1, 3, 9, or some other suitable number. The structure of the logic device 100 includes a ferromagnetic film layer 110 adjacent to a semi-isolating substrate 115. In one implementation, the ferromagnetic film 110 can be grown on top of the semi-isolating substrate 115. The polarization direction associated with this film can be along the X-axis as shown in FIGS. 1C and 1D, though other polarization directions can be chosen. In addition, the thickness of the ferromagnetic film 110 can be 10 nm, 30 nm, 70 nm, 100 nm or some other suitable thickness on the order of several tens of nanometers.

The ferromagnetic film 110 can be composed nickel-iron (NiFe), cobalt-iron (CoFe), as well as a variety of other ferromagnetic and anti-ferromagnetic films. Examples of different of applicable anti-magnetic and ferromagnetic films can include, but are not limited to, metal silicides, such as iron disilicide ($FeSi_2$). Because metal silicides can be epitaxially grown on a silicon substrate, they can be easily incorporated in the novel nano-scale computer architecture with a spin wave bus. Using metal silicides can be particularly useful for integration with conventional silicon-based VLSI (very large scale integration) circuits. A semi-isolating substrate 115 is a substrate that is made of a semiconductor material (e.g., silicon). In addition, the thickness of this substrate can be 0.001 mm, 0.1 mm, 1 mm, or some other suitable thickness.

As mentioned above, the exemplary logic device 100 of FIGS. 1C and 1D includes two asymmetric coplanar strip (ACPS) transmission lines labeled ACPS line 122 and ACPS line 124. Though shown as asymmetric lines, an alternative embodiment can result by using symmetric planar lines or some other suitable variant serving as a micro antenna. The dimensions of the ACPS lines 122-124 can be defined by the frequency of the transmitting signal. To separate these lines from the ferromagnetic film 110, the logic device 100 includes an insulator 130. This insulator layer 130 can be formed from silicon dioxide ($SiO_2$), or some other suitable insulator. In addition, the thickness of the insulator layer 130 can be 10 nm, 100 nm, 300 nm, 500 nm, or some other suitable thickness.

Turning now to FIG. 1D, this figure is a cross-sectional view of the logic device 100 illustrating the creation, propagation, and detection of spin waves in the ferromagnetic film 110. Each of the ACPS lines 122-124 can be used for spin wave excitation (i.e., as an input device) and detection (i.e., as an output device). To create a spin wave, a voltage pulse is applied to any one of these ACPS lines, which produces a magnetic field perpendicular to the ferromagnetic film's polarization direction and generates a spin wave 140, or spin wave packet. Once the spin wave is generated, it propagates through the ferromagnetic film 110 along the Y-axis. The amplitude and phase of the spin wave is detected by inductive voltage measurements. The arrows indicate the spin orientation in the lattice, though this direction can be changed. For example, the ACPS line 122 can excite the spin wave 140 that propagates through the ferromagnetic film 110. In contrast, the ACPS line 124 can detect the propagating spin wave 140. Different logic gates (e.g., AND, OR, NOT, etc.) can be realized by controlling the relative phase of a spin wave.

Exciting a Spin Wave

As spin waves are excited at one of the ACPS lines used as an input port, their propagation can be described using the Landau-Lifshitz's equation as follows:

$$\frac{d\vec{m}}{dt} = -\frac{\gamma}{1+\alpha^2}\vec{m} \times [\vec{H}_{eff} + \alpha\vec{m} \times \vec{H}_{eff}] \quad (1)$$

where $$\vec{m} = \frac{\vec{M}}{M_s}$$

is the unit magnetization vector, M, is the saturation magnetization, $\gamma$ is the gyro-magnetic ratio, and $\alpha$ is the phenomenological Gilbert damping coefficient. The first term in the bracket in equation (1) describes the precession of magnetization about the effective field and the second term describes its dissipation. $\vec{H}_{eff}$ is the effective field that is comprised of the superposition of the external field and contributions from anisotropy, and exchange fields:

$$\vec{H}_{eff} = -\nabla^2\Phi + \frac{2A}{M_s}\nabla^2\vec{m} + \frac{2K}{M_s}(\vec{m}\cdot\vec{e})\vec{e} + \vec{H}_{pulse} \quad (2)$$

where $\nabla^2\Phi=4\pi M$, $\nabla\cdot\vec{m}$, A is the exchange constant, K is the uniaxial anisotropy constant, $\vec{e}$ is the unit vector along with the uniaxial direction, and $\vec{H}_{pulse}$ is the pulse field produced by the source-drain current. The first three terms in the Eq. (2) are defined by the material properties of the ferromagnetic sample, such as the saturation magnetization, the exchange constant, and the uniaxial constant. The last term $\vec{H}_{pulse}$ is the excitation pulse, which can be artificially controlled. By adjusting the form of the excitation pulse, or external pulse, it is possible to excite a spin wave to any desired frequency and amplitude. For example, a short current pulse (e.g., <100 ps) through a conducting strip placed close (e.g., 54 µm) to the NiFe film excites a spin wave packet, which is as a linear superposition of individual spin waves.

The input device (e.g., ASPC line 122 or ASPC line 124) excites a spin wave packet with a Gaussian distribution of wave vectors. The wave packet propagates along the y direction, as shown in FIG. 1A, and can be described with one magnetization component $M_y$ as follows:

$$M_y = \frac{C\exp(-t/\tau)}{\delta^4 + \beta^2 t^2}\exp\left[\frac{-\delta^2(y-vt)^2}{4(\delta^4+\beta^2 t^2)}\right] \times \cos(k_0 y - \omega t + \phi) \quad (3)$$

where C is a constant proportional to the amplitude, $\tau$ is the decay time, $\phi$ is the initial phase, $$v = \frac{\partial w}{\partial k}(k = k_0) \text{ and } \beta = \frac{1}{2}\frac{\partial^2 w}{\partial k^2}(k = k_0)$$

are the coefficients of the first and second order terms, respectively, in the Taylor expansion of the nonlinear dispersion, $\omega(k)$.

The dispersion relation for spin waves propagating orthogonally to the magnetization vector M is given by $$\omega = \gamma\{8\pi K + (2\pi M_s)^2[1-\exp(-2kd)]\}^{1/2} \quad (4)$$

where d is the thickness of the film. When the ferromagnetic film 110 is composed of NiFe, the material characteristics are as follows: the exchange constant $A=1.6 \times 10^{-6}$ erg/cm, the multiple of the saturation magnetization $4\,M_s=10$ kG, the multiple of the anisotropy constant $2K/M_s=4$ Oe, the gyromagnetic ratio $\gamma=19.91 \times 10^6$ rad/s Oe, and the Gilbert damping coefficient $\alpha=0.0097$. The following fitting parameters are used $\tau=0.6$ ns, $k_0=0.25\,\mu m^{-1}$, and $\delta=5.7\,\mu m$ for d=27 nm. As the composition of the ferromagnetic film changes, the material characteristics change.

Figure 2:
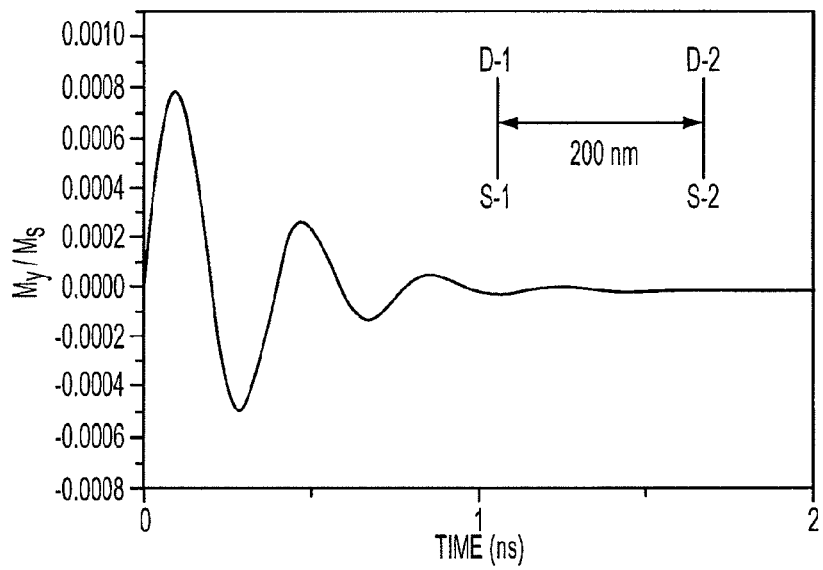
FIG. 2 is a graph illustrating the change of spin polarization as a function of time caused by a spin wave packet that is excited by a single input device.

FIG. 2 is a graph illustrating spin wave packet propagation as a function of time caused by a spin wave packet that is excited by a single input device, such as ACSP line 122 or ACSP line 124. The distance between the excitation point and the point of observation can 1 µm, 0.5 µm, 2 µm, or some other suitable distance. The spin waves produce perturbation in spin orientation that is perpendicular to the direction of magnetization $M_y$. The amplitude is much less than the saturation magnetization (i. e., $$\frac{|M_y|}{M_s} \ll 1.$$

Figure 3:
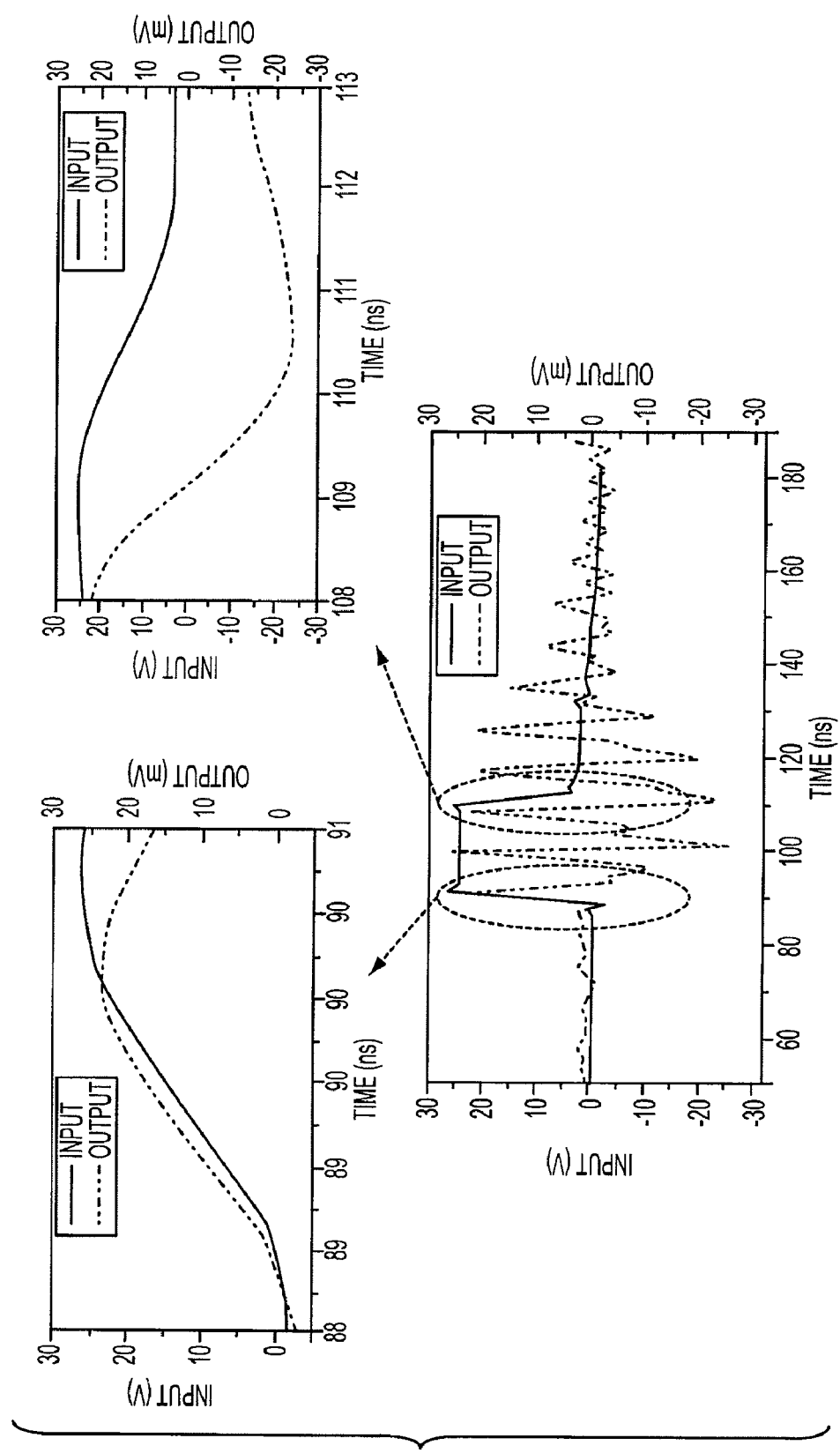
FIG. 3 is a graph illustrating experimental data on spin-wave detection by the time-resolved inductive voltage measurement technique.

FIG. 3 is a graph illustrating experimental data on spin-wave detection by the time-resolved inductive voltage measurement technique. The dashed line depicts the voltage pulse applied to the excitation line. The pulse characteristics are as follows: pulse amplitude 24.5V; rising time 1.2 ns; and pulse length 20 ns. The solid line depicts the inductive voltage signal detected by the detection line. Inductive voltage oscillation at the detection line caused by the inductive coupling via the spin waves. The output voltage signal has maximum pulse amplitude 26 mV, and the period of oscillation is 9 ns. The two top graphs in FIG. 3 illustrate the inductive voltage on the enlarged scale. The output voltage is positive as the input voltage increases, and negative as the input voltage decreases. These experimental data illustrate the possibility of signal transmission by spin waves over micrometer range distances.

Exciting a Spin Wave Using Two Input Devices

Figure 1E:
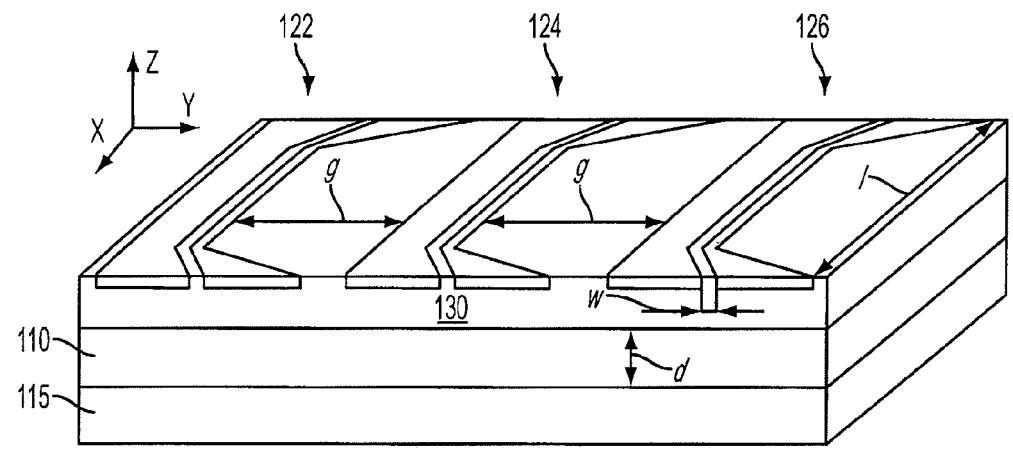
FIG. 1E is a perspective view of an exemplary logic device that includes a spin wave bus made of three transmission lines.
Figure 1F:
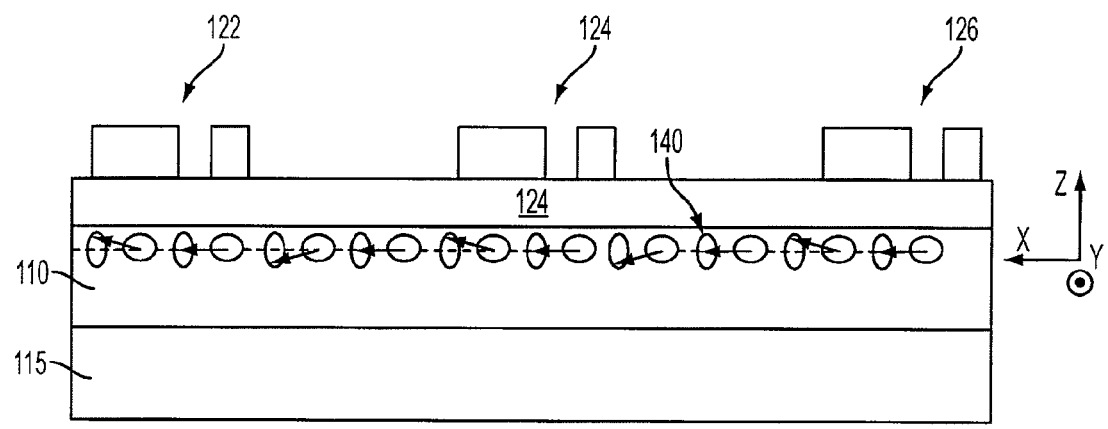
FIG. 1F is a cross-sectional view of the exemplary logic device of FIG. 1E illustrating the creation, propagation, and detection of spin waves in the ferromagnetic film of FIG. 1E.

FIG. 1E and FIG. 1F illustrate a three-ACPS device similar to the device described in FIGS. 1C and 1D, above. In FIGS. 1E and 1F, ACPS line 122 and ACPS line 126 can produce a combined effect when operating as two input devices. Each of the input devices generates a spin wave packet described by the Equation 3 (see above). The amplitudes of the input signals are the same, while the relative phase between the input signals can be controlled, for example, by the polarity of the applied current pulses. Since the current pulses having the same polarity can produce local magnetic fields oriented in the same direction, the spin wave packets have the same initial phase $\phi_1=\phi_2$, where $\phi_1$ is the phase of one packet and $\phi_2$ is the phase of the other packet.

In an alternative embodiment, the current pulses can have different polarities. In this case, the produced spin wave packets have an initial phase difference characterized by $\phi_1-\phi_2=\pi$. To find the magnetization change caused by two out of phase spin wave packets, the resultant magnetization is calculated as a superposition of waves of the same frequency from each packet as follows:

$$\overline{M}_y = \quad (5)$$
$$\frac{1}{w}\int_{-w/2\omega}^{w/2}\int[M_{1y}^2(\omega) + M_{2y}^2(\omega) + 2M_{1y}(\omega)M_{2y}(\omega)\cos(\phi_1-\phi_2)]d\omega\,dy$$

where w is the width of the detecting device along with the Y-axis (See the gap between the strips in FIG. 1F). The subscripts depict the magnetization components of the first and the second packets, respectively. The integration is made over a finite length (w=200 nm ) to take into account the effect of dephasing. In an alternative embodiment, w can be 100 nm, 300 nm, or some other suitable number. Then, inductive voltage is calculated according to the following equation:

$$V_{ind} = \left(\frac{\mu_0 l df(z,w)}{4}\right)\left(\frac{Z}{Z+0.5R_{dc}}\right)\frac{d\overline{M}_y}{dt} \quad (6)$$

where $\mu_0$ is the magnetic constant, l is the length of the sample (see FIG. 1F), $f(z,w)$ is the spacing loss function, Z is the strip line resistance, and $R_{dc}$ is the total ACPS line DC resistance. In alternative embodiments, l can be 40 µm, 50 µm, 60 µm, or some other suitable number that is on the order of tens of microns.

Figure 4:
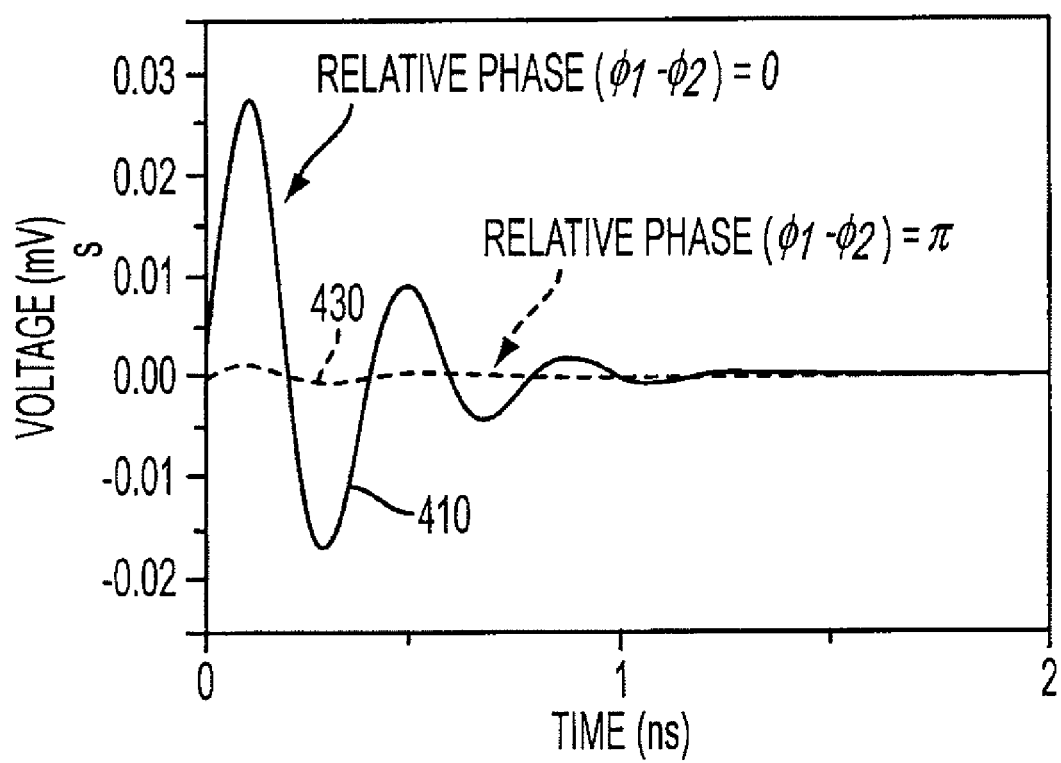
FIG. 4 is a graph illustrating the inductive voltage as a function of time both when the packets are in phase and when the packets are out of phase.

FIG. 4 is a graph illustrating the inductive voltage as a function of time both when the packets are in phase and when the packets are out of phase. The solid line 410 is the inductive voltage as a function of time when the spin wave packets are excited in phase. In contrast, the dashed line 430 is the inductive voltage as a function of time when the spin wave packets are excited out of phase. The illustrated inductive voltages depict the two potential outputs for the logic device 100, which can be formed from either ACPS transmissions lines as shown in FIG. 1D or FIG. 1F. As illustrated from the graph in FIG. 4, the amplitude of the inductive voltage is at a maximum when the spin wave packets are excited in phase. When excited out of phase, the waves from the two input devices compensate for each other and the amplitude of the inductive voltage is much less. The dephasing caused by the finite size of the detecting device is negligible since the packet coherence length $$l_c = \frac{\Delta k}{k_0^2}$$

is much longer than the width w of the detection area. In other words, $$\frac{w}{l_c} \ll 1.$$

Forming Logic Devices Using Spin Waves

Devices, such as the exemplary logic device 100, use spin waves to perform different logic functions in one device by controlling the initial phases of the waves. The set of logic gates (i.e., the two-bit gates, AND, OR, and the one-bit NOT) can be realized using the exemplary logic device 100. For example, the ACPS line 122 and ACPS line 126 shown in FIG. 1F function as input terminals, while ACPS line 124 functions as the output terminal. The input logic information is coded into the phase of the input voltage signal (i.e., voltage pulse) applied to the edge ASPC lines (i.e., ACPS line 122 and ACPS line 126). For example, $V_{input}=+1V$ can correspond to the logic state 1. In contrast, $V_{input}=-1V$ can correspond to the logic state 0. To detect the output voltage signal $V_{ind}$, a time-resolved inductive voltage measurement is used.

This measurement is made during a short period of time $\tau(\sim 10\,ps)$ at some moment of time $t_m(\sim ns)$, which depends on the logic functions desired. To recognize the output logic state, a reference voltage $V_{ref}$ is introduced. If $V_{ind} > V_{ref}$, the output logic state 1 is assigned. Otherwise, the output logic state 0 is assigned. This is more clearly seen in FIG. 5A, which is a graph illustrating the excitation voltage and the detection voltage over time. A one-bit NOT gate, or inverter, can be achieved by measuring the inductive voltage produced by a spin wave excited at one of the input terminals (e.g., ACPS line 122 shown in FIG. 1B). When $$t_m = \frac{\pi g}{v_{ph}},$$

where g is the distance between the contacts, $v_{ph}$ is the spin wave phase velocity at $k_0$, and $V_{ref}=0V$, the desired logic correlation is achieved. Though the logic device 100 can include two input terminals corresponding to ACPS line 122 and ACPS line 126, one terminal is not used when the logic device 100 is functioning as a one-bit inverter.

In addition to being used as an inverter, the logic devices 100, 200 can also function as a two-bit AND gate. To accomplish this, the following values can be assigned:

$$t_m = \frac{2\pi g}{v_{ph}} \text{ and } V_{ref} = 5\text{ mV}.$$

Figures 5A, 5B:
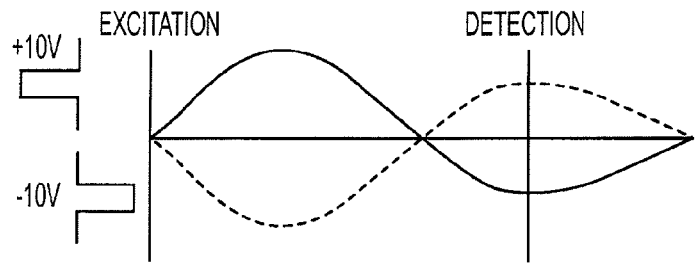
FIG. 5A is a graph illustrating the excitation voltage and the detection voltage over time.
FIG. 5B illustrates tables showing physical parameters and truth tables for embodiments of logic devices according to the present invention.

The input terminals are placed an equidistant g from the output terminal (see FIGS. 1D and 1F). Because a two-bit AND gate has two input terminals, the input signals can be received on both ACPS line 122 and ACPS line 126. As shown in FIG. 4, the two spin wave packets that are excited in phase enhance the amplitude of the produced inductive voltage, and cancel each other when excited out of phase. Because detecting an ACPS line provides a continuous signal, a reference voltage signal is used to recognize logic state in the binary form 0 or 1. FIG. 5B illustrates tables showing physical parameters (i.e., input voltage versus output voltage) and truth tables for the three logic devices (i.e., NOT gate, AND gate, OR gate).

Finally, exemplary logic devices 100 can be configured as a 2-bit OR gate. The OR gate can be realized by assigning the following values:

$$t_m = \frac{2\pi g}{v_{ph}}$$

and $V_{ref}=-5$ mV. The only criterion that is changed between creating a two-bit AND gate and a two-bit OR gate is the sign of the reference voltage, which further illustrates the ease in converting an exemplary logic device 100 to any one of the previously described gates.

When mapping an algorithm to this architecture, it is to be appreciated that once the spin waves are detected by the receiver ACPS lines, the transmitted data can either be digitized or they can be left analogue. In analogue detection mode, the ACPS line detects the inductive voltage produced by the superposition multiple waves. For example, if ten waves are sending a "1," then their analogue sum through their cumulative amplitude is computed instantly as 10. Also, this property can be used to compute logical functions as described previously. In digital detection mode, this value is digitized to just a "1," and then the computations are continued digitally.

It is possible to realize different logic gates AND, OR, and NOT controlling the relative phase of the spin waves. The voltage measured in the output port is compared to a reference voltage to determine logic state 1 or 0. This measurement is performed at the moment of spin-wave packet arrival to the detecting ACPS line area.

Spin-Wave Architectures

Information regarding spin waves and their behaviour in exemplary logic device such as 100 described herein can be applied in forming computing architecture.

A. Spin Wave Crossbar

Electronic crossbars, as are known in the art, are attractive architectures because they can realize any permutations of N inputs to N outputs. However, a shortcoming of prior electronic crossbars is that $N^2$ switches are used to transmit only N pairs of data. Embodiments according to the architecture described here, while requiring the same number of switches as standard crossbars, are capable of transmitting $N^2$ data elements. This is because each spin-wave bus is capable of carrying multiple waves at any given instance of time. Therefore, each of the N inputs in parallel can essentially broadcast its data to all of the N outputs. In other words, using this type of architecture, it would be possible to efficiently realize those types of computations that require high level of interconnectivity. Also, as compared to molecular nano-scale crossbars, this design is fault tolerant because if there is a failure in one of the N channels, other channels can be used to transmit the data. This is possible because all the channels are accessible by all the ports and each channel can handle multiple data.

Figures 6A, 6B:
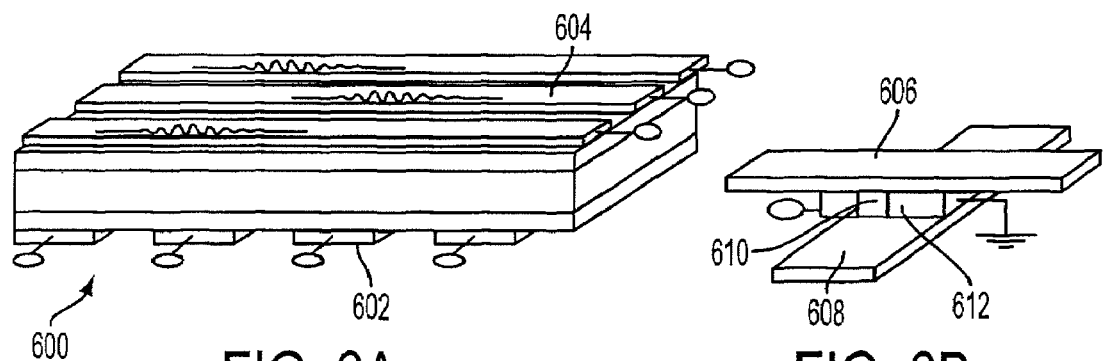
FIG. 6A is an illustration of an exemplary spin-wave crossbar architecture in an embodiment according to the present invention.
FIG. 6B is an illustration of an exemplary spin-wave switch that can be used to practice embodiments according to the present invention.

An exemplary spin-wave crossbar architecture 600 is shown in FIG. 6A. In FIG. 6A, a set of column spin-wave buses on the bottom 602 and a set of row spin-wave buses on the top 604 are connected via vertical spin-wave switches 612 as shown in FIG. 6B. The switches can be set at GHz or greater speed to direct the data to desired paths. Each switch can be activated by alternating the bias of the corresponding column and row contacts.

Figures 7A, 7B:
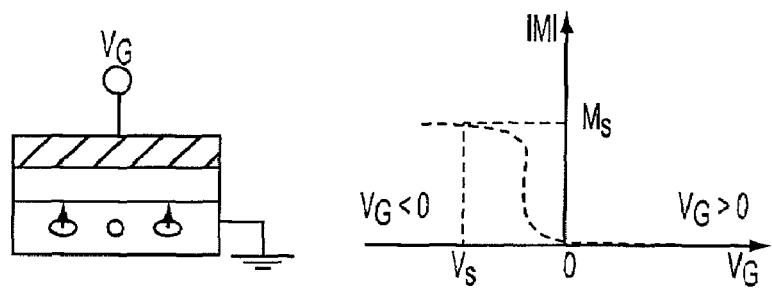
FIGS. 7(a)-7(c) are illustrations of sections of an exemplary spin-wave switch where a ferromagnetic film is divided by a region of diluted magnetic semiconductor (DMS), and is used as a magnetic channel, which can be used to practice embodiments according to the present invention.
Figure 7C:
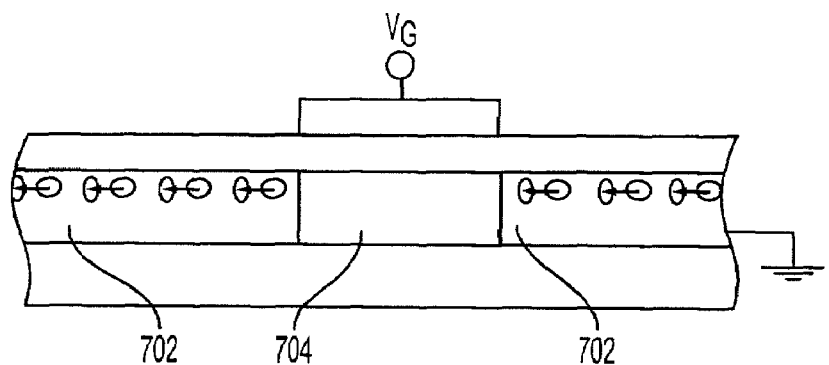

In FIG. 7(a), a cross section of an exemplary spin-wave switch is shown, which resembles the cross section of a metal-insulator-diluted magnetic semiconductor structure used for the experimental study of the effect of hole-mediated ferromagnetism as are known in the art. As shown in FIGS. 7(a), (b) and (c), a ferromagnetic film 702 is divided by a region of diluted magnetic semiconductor (DMS) 704, and it is used as a magnetic channel. The magnetic phase is controlled by the applied electric field via the effect of hole-mediated ferromagnetism. A negative gate bias increases the hole concentration in the DMS region 704, resulting in the paramagnetic-to-ferromagnetic transition, whereas a positive bias has an opposite effect as shown in FIG. 7(b). Spin waves can propagate through the DMS cell 704 only if it is in the ferromagnetic phase. In the ferromagnetic phase ("On" state) the switch transmits spin waves, while in the paramagnetic state ("Off" state) it reflects any incoming spin waves.

The structure of the spin-wave switch based on the effect of hole-mediated ferromagnetism may be used for the vertical integration of the spin-wave buses. In FIG. 6B, two vertically separated ferromagnetic films 606, 608 are shown with the DMS cell 610 in the place of intersection. In this structure, the switch 612 serves as a connector between two spin-wave buses 606, 608. At the negative applied bias (ferromagnetic phase), the switch 612 provides coupling between the spins in the ferromagnetic films 606, 608. At the positive bias (paramagnetic phase), there is no coupling between the films 606, 608. The use of the spin-wave switches for vertical integration makes possible array-based architectures such as an array of nanowires.

Analysis of a spin-wave switch can be performed on the basis of the Heisenberg model, as is known in the art, by treating the ferromagnetic film and the DMS cell as two media that have different exchange integrals J. The Hamiltonian for the system ferromagnetic film plus DMS cell can be expressed as follows:

$$\frac{d\vec{s}_i}{dt} = J(V_{g_i}) \cdot \vec{s}_i \times [\vec{H}_{\it{eff}} + \alpha \vec{s}_i \times \vec{H}_{\it{eff}}]$$

where $\vec{s}_i$ is the spin operator of the i-th DMS cluster, $J(V_{g_i})$ is the coupling parameter which is a function of the gate voltage, and $\vec{H}_{\it{eff}}$ is the effective magnetic field produced by the superposition of spin waves in the ferromagnetic layer. The propagation/reflection of spin waves through the interface between the DMS cell and the ferromagnetic film depends on the ratio $J_{DMS}/J_{film}$, where $J_{DMS}$ and $J_{film}$ are the exchange integrals for the DMS cell and the ferromagnetic film, respectively. The exchange integral in the ferromagnetic film is constant, while the exchange integral in the DMS cell is a function of the gate voltage $J_{DMS}=J_{DMS}(V_G)$. In the two ultimate limits $J_{DMS}/J_{film}=1$ and $J_{DMS/Jfilm}=0$, we have complete transmission and complete reflection, respectively.

B. Spin Wave Reconfigurable Mesh

Figure 8:
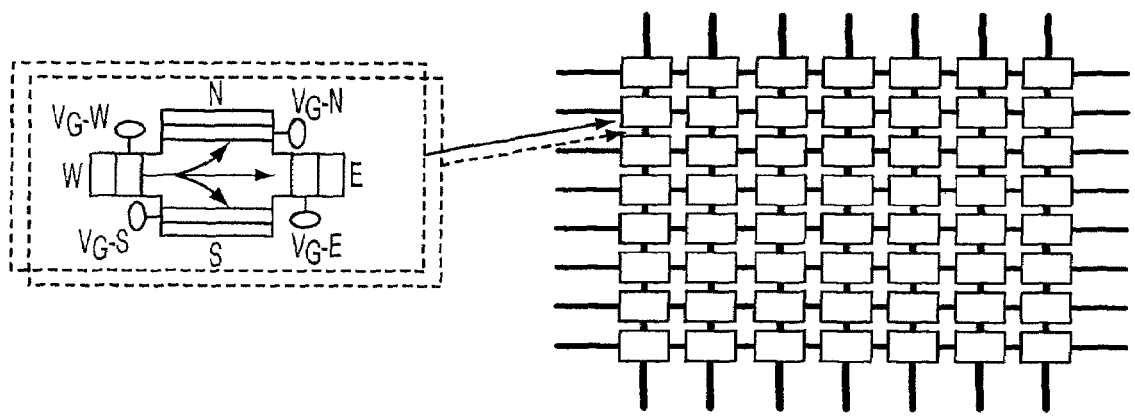
FIG. 8 is an illustration of an exemplary nano-scale spin-wave reconfigurable mesh of size $N^2$ comprising an $N \times N$ array of processors connected to a reconfigurable spin-wave bus grid, where each processor has a locally controllable bus switch architecture in an embodiment according to the present invention.

A mesh is a network topology in which devices connected in a two-dimensional (2D) grid format are generally known to those of ordinary skill in the art. Reconfigurable meshes are also known in the art; however, prior reconfigurable meshes utilize charge transfer for information transfer and operate at the micro-electronic scale of integration. FIG. 8 illustrates an exemplary nano-scale spin-wave reconfigurable mesh of size $N^2$ comprising an N×N array of processors connected to a reconfigurable spin-wave bus grid, where each processor has a locally controllable bus switch. Information transfer in the exemplary mesh of FIG. 8 is accomplished by encoding the information into the phase of spin waves. In FIG. 8, a set of column spin-wave buses on the bottom and a set of row spin-wave buses on the top are connected via spin-wave switches 612 as shown in FIG. 6B. Each spin-wave switch 612 is placed at the grid point of the mesh. The switches allow the broadcast bus to be divided into sub-buses providing smaller reconfigurable meshes. These switches are similar to crossbar switches described above, except that each reconfigurable mesh switch has a plurality (e.g., four) controllable gates to route the signal in different directions.

The nano-scale reconfigurable mesh of size N as shown in FIG. 8 occupies N×N area, under the assumption that processors, switches, and a link between adjacent switches occupy unit area. However, unlike standard reconfigurable meshes (and standard meshes), area is at a nano-scale level as opposed to the standard reconfigurable meshes that are currently available at micro-scale level of integration.

C. Spin-Wave Fully Interconnected Cluster

Figure 9A:
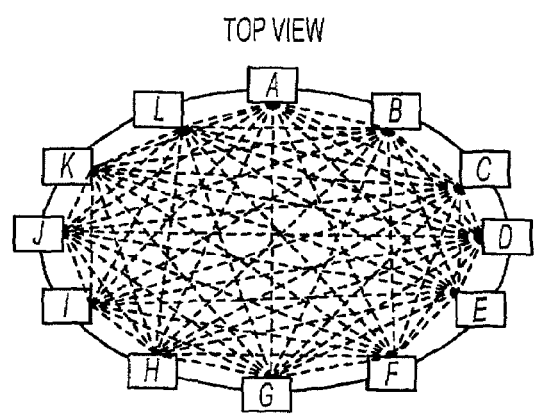
FIGS. 9A and 9B illustrate views of an exemplary fully-connected cluster wherein each node can broadcast to all other nodes of the cluster simultaneously.
Figure 9B:
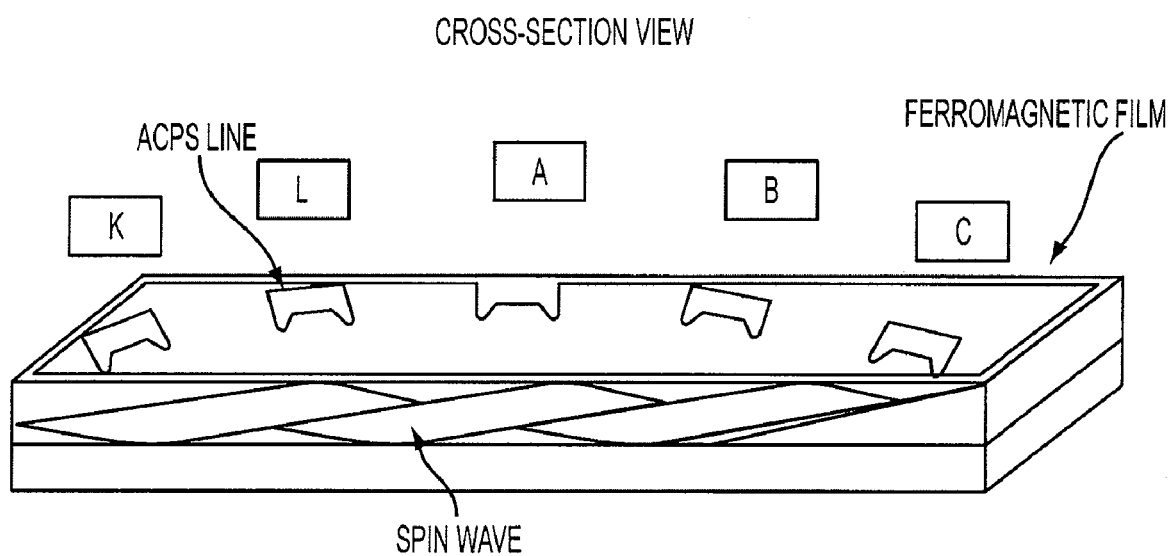

FIGS. 9A and 9B illustrate an exemplary fully-connected cluster wherein each node can broadcast to all other nodes of the cluster simultaneously. Similarly, a node can receive and process multiple data simultaneously. An exemplary fully interconnected architecture is comprised of N computing nodes, all of which intercommunicate with spin waves. FIG. 9A shows the top view of the architecture in which the N computing nodes are placed around a circle on a magnetic film. The area requirement of this architecture is $O(N^2)$ as opposed to the $O(N^4)$ area requirement if electrical interconnects were to be used and all distances in this architecture are in nano-scale.

Unlike electrical interconnection networks, in which only one transmission can be done at a time, here multiple simultaneous permutations are possible by transmitting the spin waves over different frequencies. The information is coded into the phase of the spin waves in the sender and is detected by the receivers. In addition, within each frequency, data can be sent to one or more other nodes from each node.

FIG. 9B shows a cross-sectional view of the layout of an exemplary fully-connected cluster on a semiconductor chip. Each node of the exemplary cluster is an asymmetric co-planar strip (ACPS) line as described herein, which can be used as a sender or receiver at each point of time. Normally, in architectures where the phases of the waves are the means of information transmission, the exact location of the nodes with respect to the size of topology is an important design issue. The distance between the sender and receiver has to be at a length that is a multiple of the wave's wavelength; otherwise, the receiver might receive the wave with a π radian phase-shift, which is a "0" instead of a "1" or vice versa. However, in embodiments according to the present invention, distance between sender and receiver is not an issue because the wavelengths of spin waves are considerably larger than the distance between the nodes. The speed of spin waves is around $10^5$ m/s. Assuming an input frequency range of approximately 1-10 GHz, wavelength will be in the order of $10^{-4}$ to $10^{-5}$ m, while the distances are nano-scale or $10^{-9}$ m. In other words, the wavelengths of the spin waves are some orders of magnitude greater than the distances between the nodes. Therefore, all the nodes receive the same phase regardless of their location, and there is no need to place the nodes in specific distance relative to the other ones.

In the architecture shown in FIG. 9A, each node can broadcast to all other nodes simultaneously. For instance, node A can broadcast to all the other nodes. This requires that the receiving frequencies of all the nodes be tuned to the same frequency as the transmitting frequency of node A. Similarly, a node can receive and process multiple data simultaneously. For instance, node G can receive multiple data simultaneously from other nodes. In this case, the requirement is that all the nodes should transmit at the same frequency as the receiving frequency at which node G is tuned.

To distinguish the data being transmitted to different nodes, transmissions are done at distinct frequencies. In a way, this is similar to having various radio stations, where each broadcasts at a different frequency. To listen to a specific station, one tunes to the corresponding frequency. Here, similarly, each node can broadcast or receive at a specific frequency. Furthermore, at a given frequency, a node can listen to multiple waves simultaneously. Using the superposition property of waves, it can compute the sum of all waves destined to it.

In addition to the transmissions at different frequencies, all nodes in the cluster architecture of FIGS. 9A and 9B can work on the same frequency in a broadcast mode, or they can be directed to specific locations using phased array techniques, as are known to one of ordinary skill in the art. It is also possible to combine the phased array technique with multiple frequencies. This way, for each frequency, some of the waves are only transmitted to desirable directions and are received by the intended sources.

In the exemplary architecture of FIGS. 9A and 9B, the communication is done via spin waves but the computation is done electronically. When mapping an algorithm to this architecture, it is to be appreciated that once the spin waves are detected by the receiver ACPS lines, the transmitted data can either be digitized or they can be left analogue, as described herein.

Hierarchical Spin-Wave Architectures

Hierarchical multi-scale architectures involve the integration of spin-wave architecture with micro-electromechanical systems (MEMS), as are known to one of ordinary skill in the art. Spin wave architectures are interconnected electro-optically at micro-scale levels and via spin-waves at nano-scale level to form hierarchical multi-scale architectures. Embodiments of hierarchical multi-scale architectures described herein are generally derived from an optical reconfigurable mesh (ORM), which is a MEMS architecture that supports several types of electrical and optical routings. The attenuation of a spin wave, which is about 50 microns, makes spin-wave fully available for use in nano-scale architectures. However, at the same time, it limits a module's (e.g., crossbar, cluster, mesh) size to about 50 microns. In order to overcome this size limitation, embodiments according to the invention integrate spin-wave architecture into a MEMS chip.

Figure 10A:
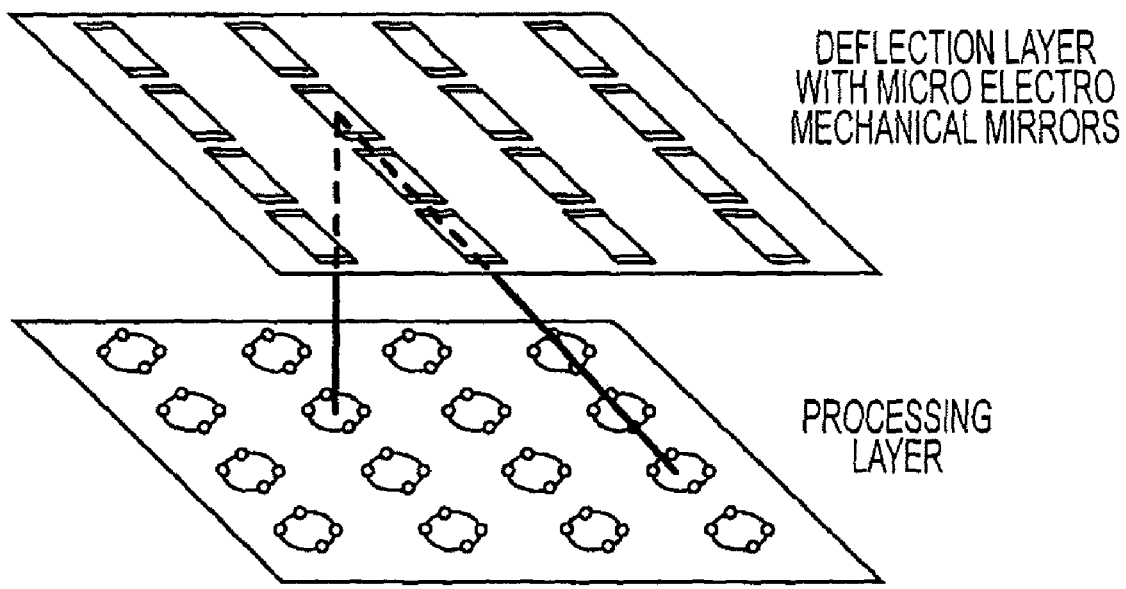
FIGS. 10A and 10B are illustrations of an exemplary ORM architecture as known to one of ordinary skill in the art, where the exemplary ORM is comprised of two layers, a deflection layer and a processing layer.
Figure 10B:
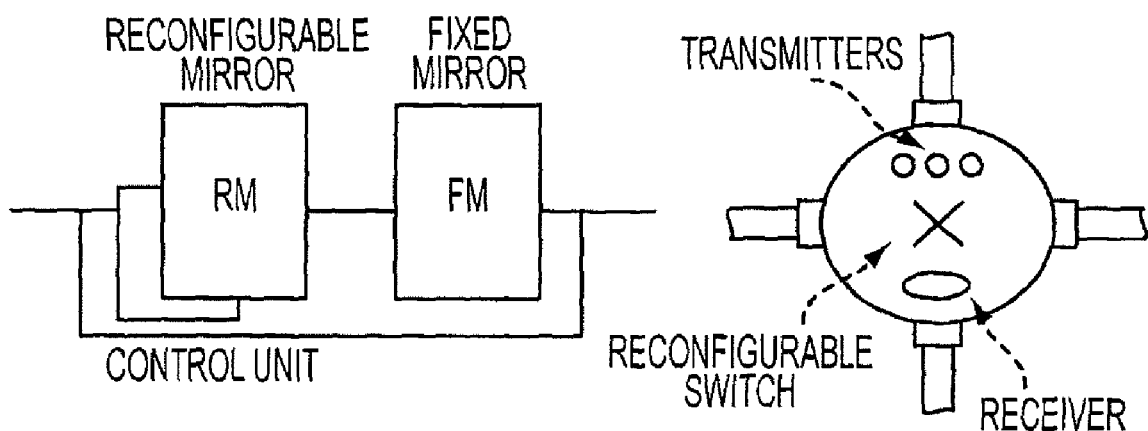

ORM architecture is known to one of ordinary skill in the art. Generally, ORM is comprised of two layers, a deflection layer and a processing layer, as shown in FIG. 10A and FIG. 10B. The deflection layer can be comprised of $N^2$ deflecting units, while the processing layer can be comprised of $N^2$ processing units in each of the nano- and micro-scale levels. The processors on the processing layer are interconnected as a reconfigurable mesh and can also intercommunicate optically using the deflection layer.

A processing layer of an ORM is comprised of N×N processing units. As shown in FIG. 10B, an exemplary processing unit is comprised of three optical transmitters and one receiver, though other configurations are contemplated within the scope of this invention. One transmitter, for example TR(1), is directed towards the control unit of the deflection unit. A second transmitter, for example TR(2), is directed towards a reconfigurable mirror (RM) of the deflection unit, and a third transmitter, TR(3), is directed toward a fixed mirror (FM) of the deflection unit. Each processing unit has a constant number of log N bit memory cells and simple computation capabilities. It is connected to other processing units in the mesh by the electrical reconfigurable buses. Each processing unit controls the internal reconfigurable switches and is responsible for sending and receiving data to and from the other processing units. In reference to a particular processing unit, it can be indexed as being in the $i^{th}$ row and the $j^{th}$ column of the mesh on the processing layer as P(i,j) in which $1 \leq i, j \leq N$.

An exemplary deflecting layer of the ORM contains N×N deflecting units. Also as shown in FIG. 10B, each exemplary deflecting unit is comprised of two mirrors and an arithmetic control unit. One mirror is a fixed mirror (FM), which transfers data from the processor under it to a fixed address whenever it is used. Another mirror is a reconfigurable mirror (RM). The control unit receives an address from the processor under it, translates the address, and controls the direction of the RM. Since the angle of the FM is fixed, the processor can send data directly from one dedicated transmitter to its destination without going through the control unit. A particular deflecting unit (a mirror and the related control unit) located directly above P(i,j) can be referred to as M(i,j).

Data can be routed in three different ways in an ORM architecture. Electrical routing is done only through electrical buses. Optical routing uses free-space optics. Electro-optical routing uses electrical and optical free-space connections to allow a complete connection among N processors.

Electrical routing in ORM is similar to that for reconfigurable meshes, as are known in the art. This type of routing is any routing from one node to another or a broadcast, which uses electrical buses in the reconfigurable mesh only. This type of communication is suitable for providing arbitrary configuration of the buses in the processing layer.

Optical routing in ORM is routing through optical free-space interconnections only. The data transfer does not use any electrical bus in the system. All $N^2$ processors can communicate in unit time delay as long as there is only one read or write from or to each location.

Optical connections can be established between two processors through an RM. A connection phase between two processors is comprised of two cycles. In a first cycle, each processor sends the address of its desired destination processor to the arithmetic control unit of its associated mirror using a dedicated laser TR(1). The arithmetic control unit of the mirror computes a rotation degree such that both the origin and destination processors have equal angle with the line perpendicular to the surface of the mirror in the plane formed by the mirror, the source processor and the destination processor. Once the angle is computed, the mirror is rotated to point to the desired destination. In the second cycle, the connection is established by the laser beam, TR(2), carrying the data from the source to the mirror and then from the reflected mirror towards the destination. An example of an optical routing from processor P(2,2) to processor P(4,3) is shown in FIG. 10A.

The read operation also has two phases. In the first phase, the read requirement and the reader's address are sent to the processor, which stores the desired data. In the second phase, the data is sent back to the reader depending on the reader's address. Both phases use a two-cycle write routing method, as is known to one of ordinary skill in the art.

Electro-optical routing is a communication mechanism that establishes full connectivity among only the N processors situated diagonally in the processing layer on the $N^2$ processors in the ORM (i.e., for processors P(i,j) where $1 \leq j \leq N$). This routing technique uses electrical buses on the processing layer and fixed mirrors on the deflection layer.

An exemplary connection for electro-optical routing is implemented as follows. Each processor P(i,j) is associated with the $j^{th}$ row of the deflection unit, where the row contains N fixed mirrors. The $i^{th}$ fixed mirror in that row for $1 \leq i \leq N$ is directed to the processing unit P(i,i). There are two possible types of routing: Exclusive Read Exclusive Write (EREW) and Concurrent Read Concurrent Write (CRCW). In EREW, any PE P(i,i) sends data to P(k,k) in the following way: First, P(i,i) sends the data to P(i,k) through the electrical row bus; Then, P(i,k) sends data to P(k,k) through transmitter TR(3) and its deflector M(i,k). The variety of techniques available in electro-optical architecture help make ORM a powerful computing model.

Disclosed herein are three multi-scale hierarchical architectures that embody the ORM architecture as well as the spin-wave architectures previously described. In these hierarchical architectures, in addition to the standard processing layer of ORM at a micro-scale level, there is another processing layer at the nano-scale level. The nano-scale processing layer includes a set of spin-wave-based nano-scale computing modules such as a crossbar, cluster or mesh. Similar to the ORM architecture, there is also a deflection layer that is responsible for optical interconnectivity in the hierarchical architectures.

A. Hierarchical Multi-Scale Crossbar

Figure 11:
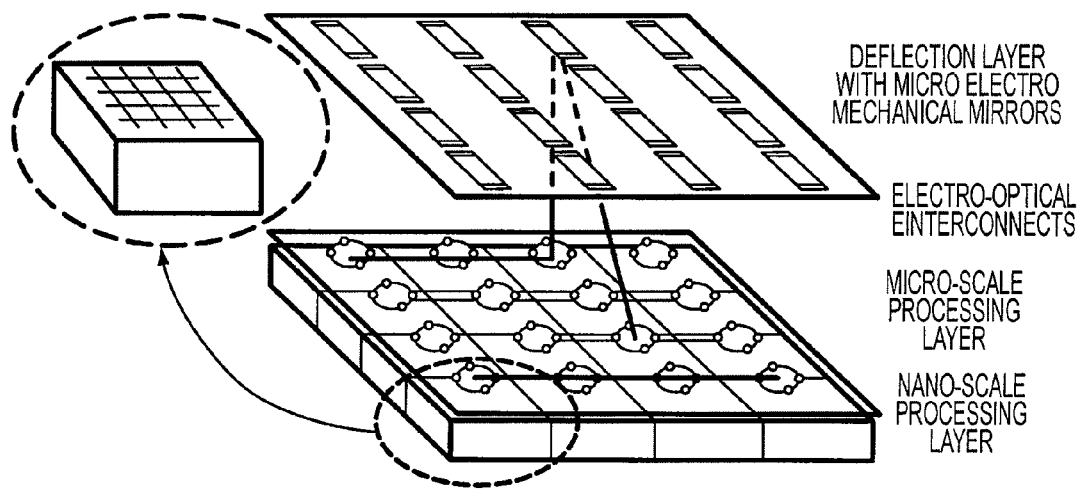
FIG. 11 is an illustration of an exemplary embodiment of a hierarchical multi-scale crossbar according to the present invention.

FIG. 11 is an illustration of an exemplary embodiment of a hierarchical multi-scale crossbar according to the present invention. This hierarchical architecture of the exemplary architecture of FIG. 11 is comprised of a set of nano-scale spin-wave-based crossbars that use the electro-optical routing mechanism of ORM as previously described herein to communicate among modules, as shown in FIG. 11. In electro-optical routing, as mentioned in the previous section, no reconfiguration of mirrors is necessary and only fixed mirrors are used. The data communication in each row is through electrical interconnections, while the fixed mirrors provide vertical paths among processors. Since only electrical switches and fixed mirrors are used, this architecture has a switching time of nano-seconds. In FIG. 11, for example, the electrical connection between P(4,1) and P(4,4) has been highlighted, and the electro-optical routing from processor P(1,1) to processor P(3,3) is shown. P(1,1) makes an electrical connection to P(1,3) while P(1,3) is connected to P(3,3) using M(1,3) fixed mirror. As described herein, spin-wave crossbars are attractive architectures for hierarchical integration because they are capable of transmitting $N^2$ data elements.

B. Hierarchical Multi-Scale Reconfigurable Mesh

Figure 12:
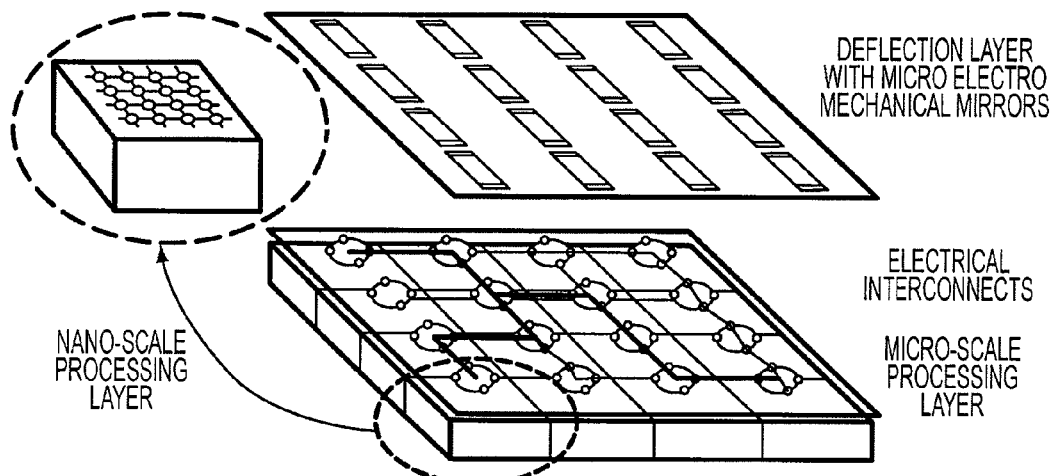
FIG. 12 is an illustration of an exemplary embodiment of a hierarchical multi-scale reconfigurable mesh according to the present invention.

FIG. 12 is an illustration of an exemplary embodiment of a hierarchical multi-scale reconfigurable mesh according to the present invention. This hierarchical architecture of FIG. 12 is comprised of nano-scale spin-wave-based reconfigurable meshes, which at the module level are interconnected via electrical routing Each of the nano-scale reconfigurable meshes shown in FIG. 12 are comprised of an N×N array of nodes connected to a reconfigurable spin-wave bus grid, where each node has a locally controllable bus switch. In this architecture, similar to the crossbar, a set of column spin-wave buses at the bottom and a set of row spin-wave buses on the top are connected via the spin-wave switches. Each switch is placed at the grid point of the mesh. Basically, except for the spin-wave buses, the nano-scale spin-wave-based reconfigurable mesh is similar to a standard reconfigurable mesh, as are known in the art, with a switching speed of a few nanoseconds. However, in the spin-wave-based version, at any given instance, O(N) messages, as opposed to one message, can be sent over each bus using different frequencies. Reconfigurable meshes are suitable architectures for image-processing tasks because images can be mapped onto them in a straightforward fashion by one of ordinary skill in the art.

C. Hierarchical Multi-Scale Fully-Interconnected Clusters

Figure 13:
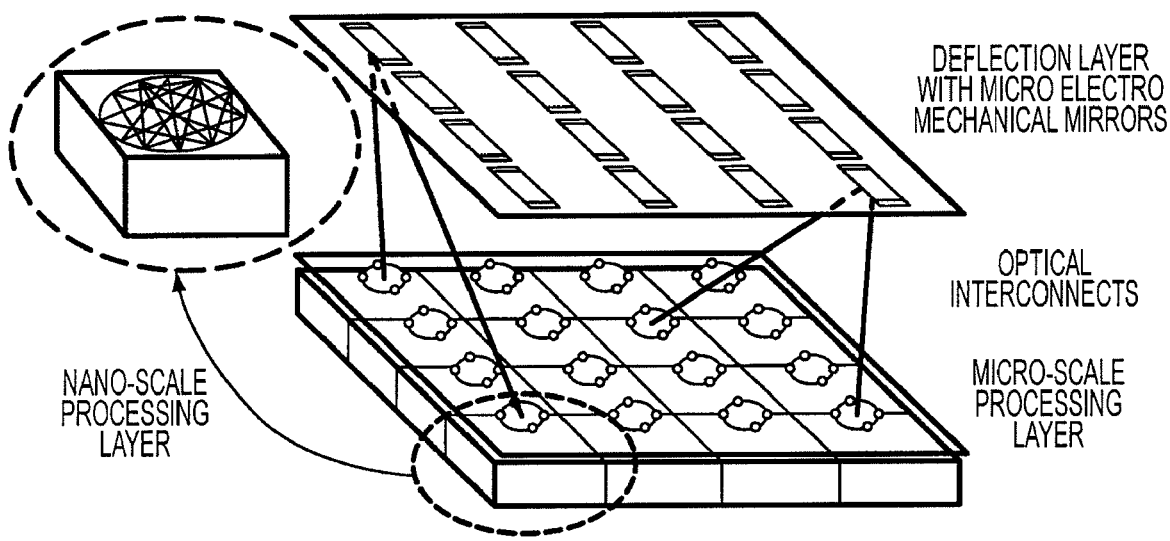
FIG. 13 is an illustration of an exemplary embodiment of a hierarchical multi-scale fully interconnected cluster according to the present invention.

FIG. 13 is an illustration of an exemplary embodiment of a hierarchical multi-scale fully interconnected cluster according to the present invention. The hierarchical architecture of FIG. 13 is comprised of a set of nano-scale spin-wave-based fully interconnected clusters at the nano-scale level that are fully interconnected through the free-space optical routing of the ORM using the reconfigurable MEMS mirrors at micro-scale level. Because of the reconfigurable mirrors used, the switching speed at the micro scale level can be slower than the switching speed in the nano-scale level.

As described more fully herein, in the fully interconnected spin-wave-based clusters, each node can simultaneously broadcast to all other nodes, and can concurrently receive and process multiple data. The cluster architecture is comprised of N computing nodes placed in a substantially circular arrangement on a magnetic film. Each node is an ACPS line, which can be used as a sender or receiver at each point of time. The nano architecture of the cluster allows nodes to exchange $O(N^2)$ messages at any given time, using different frequencies, while having an $O(N^2)$ area.

The hierarchical multi-scale fully-interconnected clusters architecture realizes full interconnectivity at each level for any type of random pattern, and therefore it is a desirable architecture for implementing types of applications that require high and random interconnectivity such as, for example, biologically inspired computations and neural networks.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary of the invention and are not intended to limit the scope of what the inventors regard as their invention. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

I. Parallel Algorithm Design Techniques

Presented herein are generic parallel processing techniques that are mainly designed for hierarchical spin-wave reconfigurable meshes, though the implementation of some of these techniques using spin-wave crossbars and fully interconnected clusters are also described. When using these architectures, it is to be appreciated that two different types of data detections are possible at the nodes. Once the spin waves are detected by the receiver, the transmitted data can either be digitized or they can be left analog.

A. Find the Maximum/Minimum

To find the maximum or minimum of $O(N^2)$ inputs, with a maximum value of N, on an exemplary hierarchical reconfigurable mesh comprises assigning each value to a processing node on grid points of the reconfigurable mesh. Next, each node checks its most significant bit (MSB). If MSB is 1, it broadcasts '1' to all the other processing nodes. If MSB is 0, on the other hand, it listens to the channel. If there is a 1 on the bus, that node gets disabled. At the next step, the nodes check their next most significant bit. This procedure is repeated for all the bits. Since the maximum value of the inputs is N, this procedure takes O(log N) time. If the number of inputs is at most N, the minimum and maximum can be found in O(1).

Finding minimum is similar to finding maximum except that in the case of MSB=1, the node broadcasts '1' to all the nodes connected to it and at the same time listens to the channel. If there is a 1 on the bus, that node becomes disabled.

The same implementation technique applies when using one single column of a spin-wave crossbar. In that case, the max/min of at most N inputs can be mapped to N processing units, and one of the columns would be used as the shared medium, where nodes broadcast their MSB. All the switches on that column must be turned on to connect the processing units to the shared bus.

This algorithm can also be implemented on a fully interconnected cluster in a similar fashion, except that in the fully interconnected cluster, there are no switches to be set. All the nodes are connected to the shared medium, where they can broadcast their MSB, or receive signals from other nodes.

It is to be appreciated that on the three architectures, the whole routine can be performed simultaneously on disjoint sets of input, using different frequencies for each set. This cannot be done on a standard VLSI reconfigurable mesh due to conflicts on the buses.

An Application Example

Finding the maximum/minimum routine is used in designing several applications. Finding the nearest neighbor figure algorithm is a sample of image processing applications that use this routine. The input to this algorithms is a digitized (black and white) image with processor (i,j) storing the pixel (i,j), $0 \leq i,j \leq N-1$, in the plane, where the black pixels are 1-valued and white pixels are 0-valued. It can be shown that given an N×N image, using an N×N reconfigurable mesh with spin-wave buses, the nearest neighbor of a single figure can be found in O(log N) time.

Before finding the nearest neighbor, the figures need to be identified and labeled, and their convex hull should be found. The time complexity of a labeling algorithm is O(log N), and the convex hull of a figure can be found in O(log N) as well, as shown herein.

In order to find the nearest neighbor of a figure on a spin-wave reconfigurable mesh, switches are configured so that all nodes in the whole image are connected to each other. For all the extreme points of the figure under consideration, the closest '1' belonging to another figure should be found. For this, each extreme point, a node with at least one '0'-valued neighbor, broadcasts its address, as well as its ID, to all the four directions. As soon as a black node from another figure (with a different ID) receives this broadcasted signal it computes its distance with that node and sends it back to that node. It also blocks that signal and does not let it pass though.

Using the technique explained above, the top, bottom, right, and left neighbors are checked, but some closer neighbors that are located diagonally from that figure may be missed. To address this issue, the algorithm is revised to use the white nodes as well.

All the black nodes (including non-extreme points) broadcast their address and ID to their neighbors, and whenever a black pixel receives the data, it blocks it. So now all the black (and white) nodes, know their distance from the closest neighbor from a different figure. When an extreme point broadcasts its address, besides the black nodes in the four directions, all the intermediate white nodes which have received this broadcasted signal, find the distance between that node and their nearest black node (with a different ID). On each side of the extreme point, the minimum distance of all these nodes is found in a binary tree fashion, e.g. each two adjacent nodes, find their minimum which will be compared to the minimum of their adjacent pair, and so on. For finding these minimum values the max/min routine previously explained can be used. The time complexity of this routine is O(log N), so all the extreme points know their closest neighbor in O(log N) time. The next step comprises finding the minimum number among the data of all the extreme points, which takes O(1) time, therefore, the overall time complexity of nearest neighbor algorithm is O(log N).

B. Find the First/Last in a List

In many applications a need exists to find the first or last element of a list. In geometric algorithms, for instance this operation is useful to find the extreme points of a figure. A labeling algorithm described in M. M. Eshaghian-Wilner, A. Khitun, S. Navab, and K. L. Wang, "The Spin-wave Nano-Scale Reconfigurable Mesh and the Labeling Problem," Proceedings of the Trends in Nanotechnology Conference, France, Sep., 2006, and recommended for inclusion at a special issue of the ACM Transaction on Emerging Technology, 2006-2007, incorporated herein by reference, is an application example that uses this routine several times. Described below is a routine for finding the first/last in a list along with an image processing application, namely finding the convex hull of a figure, to show the usage of this routine.

Figure 14:
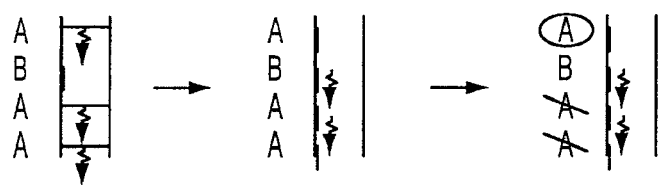
FIGS. 14 and 15 are exemplary illustrations for practicing an aspect of an application according to an embodiment of the present invention.
Figure 15:
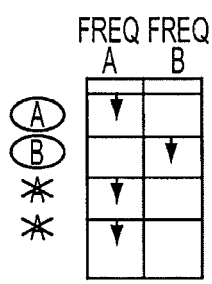

To find the first or last element of at most N inputs, the step is to store the inputs in the processing elements in a column. The local topmost nodes on that column are found by making each node send a signal downward. This procedure begins by turning off all the switches above each node (disconnect the channel) to force the signal sent by each node downwards. Then all nodes simultaneously send out a signal downward and turn on all switches (reconnecting the channel), thereby letting all signals pass through the bus. Each node that receives a signal will become disabled. As the result, the only active nodes are the local topmost nodes that have not received a signal. This procedure is performed in O(1) time. An example of this procedure is shown in FIG. 14, where the first "A" in the list is found by disabling the rest of the "A"s. If different sets exist among the inputs, it is possible to find the first element of each set using frequency division multiplexing. For instance, in the above example, there are two sets (As and Bs). As shown in FIG. 15, the first A and B in the list are found simultaneously by performing the routine on two different frequencies for A and B. This method is used in the graph formation algorithm for partial order multiple sequence alignment as described in M. M. Eshaghian-Wilner, A. Khitun, S. Navab, and K. L. Wang, "A Nanoscale Spin-Wave Crossbar for Highly Concurrent and Fault Tolerant Routing," submitted to IEEE Transactions on Nanotechnology, 2006, incorporated herein by reference.

Unlike a reconfigurable switch that can be controlled in four different directions, a crossbar switch has just two possible status: "on" or "off". Therefore, it is not possible to force the wave in only one direction. Therefore, the first/last routine cannot be implemented on a crossbar in a similar fashion as a reconfigurable mesh.

This implementation does not apply to a fully interconnected network either, since in that symmetric architecture, there is no notion of first or last.

An Application Example

In this exemplary application, it is shown that given an N×N image, using an N×N reconfigurable mesh with spin-wave buses, the convex hull of a single figure can be found in O(log N) time.

This algorithm operates in two steps. First, the Right Most (RM) and the Left Most (LM) '1' in each row are found. Then it will be verified if these points are extreme points or not.

The "first in the list" routine is used to find the Left Most and Right Most black pixel or '1'-valued on each row. In other words, first all the left and right switches of each node are tuned on, so that all the channels between the nodes in the same row are open. Then, each black node sends out a '1' signal on the bus and then turns off its left hand side switch, thereby closing that section of the channel and not letting the waves pass though from right to left. The closing of that particular section belonging to the node will still allow the node to receive signals, but it will not let signals travel beyond (to the left) of that node. If at least one black pixel exists on a row, all the nodes on that row will receive a '1' except the Left Most (LM) node. Now that LM is identified in each row, the same operations are performed to find the Right Most (RM) node. The only difference is to turn the right hand side switch and not let the waves go from left to right. Since setting all the switches in all the rows is done in parallel, finding RM and LM takes O(1) time.

Figure 16:
FIG. 16 is an exemplary illustration for practicing an aspect of an application according to an embodiment of the present invention.

The verification is performed by having the ith column compute the enclosing angel made by the 1's in the image with the RM of the ith row ($RM_i$). This angle is defined to be the smallest angle $\Phi_i$ such that all the 1's are enclosed inside the region X $RM_i$ Y as shown in FIG. 16. For this, first all the RMs broadcast their address to all the 1's in their row. So now all the columns have a copy of all RM nodes. Each $RM_i$ sends its address to all the black nodes in the ith column, and all these nodes compute their angle with $RM_i$. The maximum value (angle) of the nodes above $RM_i$ and below it are found. $RM_i$ is an extreme point if and only if the sum of these two angles is less than 180 degrees. This step is repeated for $LM_i$. The maximum angle value is found in O(log N) time, using the max/min routine explained previously herein. Therefore, the total time complexity of finding the convex hull of a figure will be O(log N).

C. Find the All Prefix Sum

The problem of all prefix is to compute the sum of first j elements in an array and store the sum in the jth element. Using this algorithm, the sum of all the input values will be computed and stored in the last element. In this section it is shown how this operation is performed in O(1) time on spin-wave architectures.

To find the All Prefix Sum of at most N inputs, the inputs are mapped to the processing nodes on one column of the spin-wave reconfigurable mesh. At the beginning, all the switches are turned on. Then, each node sends a signal with an amplitude equal to the value it has stored, and immediately turns off the switch above it to direct its generated wave downwards. Note that for synchronization purpose, each node generates its spin wave signal after a short period of time to compensate the spin-wave propagation delay in the ferromagnetic channel. This short period of time has to be equal or greater than the distance between adjacent nodes divided by the speed of spin waves, which is in the order of $10^{-9}/10^4 = 10^{-13}$. Considering the fact that the frequency is in the order of GHz or even THz, this whole process is considered as constant time. Due to superposition property of spin-waves, the sum of previous values is found at each element. The main idea behind superposition is that when nodes transmit signals on the same frequency, the signals will superpose in amplitude when they meet. The amplitude of the superposed wave received by each node will be the prefix sum on that node.

A special case of Prefix Sum routine, is counting the number of elements that come before a certain element in the list. In this case, all the nodes transmit a signal downwards with an amplitude of 1. In each node, the total amplitude of all the superposed signals sent by the nodes above shows the number of elements before that element in the list.

Another special case of this routine, would be the summation routine, where the summation of all nodes can be found in constant time. This is basically the Prefix sum routine at the last node of the list. Note that the Prefix sum routine can be performed on at most N inputs, whereas the summation can have as many as $N^2$ inputs, on all the nodes of the reconfigurable mesh. All the processing elements send a signal with an amplitude equal to the value they have stored. Utilizing the superposition property of spin-waves, the summation of the input values can be found. If the nodes tune their receiver's frequency on their sender's frequency, they all receive the superposition or "sum" of the input values.

As described for first/last routine (above), it is not possible to send signals downwards in a crossbar or in fully interconnected cluster, so this routine can not be implemented on these two architectures. However, the special case of finding the summation of all inputs, for at most N inputs, can be implemented on one single column of a crossbar and on a fully interconnected cluster, as explained in max/min routine.

An Application Example

Consider the problem of creating a histogram of input values, each value representing a type, where all such values are in the range of 1 . . . N. Assuming that the number of inputs is at most $N^2$, each input can be stored in one processing node on the spin-wave reconfigurable mesh. It can be shown that this problem can be solved in O(1) time.

There are two approaches to store the result of the histogram. The first approach is to choose one node of each type as the representatives of that type. The first of each type in the list can be found to represent its type, using the routine explained in the previous section. The second approach is to keep track of the number of each type in all the nodes of that type.

Next step is to count the number of times each value has been repeated in the list and store the sum at each (or the representative) node. As explained above, this problem is a subset of "finding the sum" routine. In this case all the nodes send a value of '1' and not an arbitrary value. Note that this routine should be performed on each type of input; however, using different frequencies, these separate routines can be done simultaneously. In other words, each type's sender and receiver are tuned on a distinct frequency. Due to superposition characteristic of the waves, each node receives the sum of '1's sent on its tuned frequency, which is the number of nodes of that type.

II. Parallel Routing and Broadcasting

In the following are illustrated the routing features of spin-wave architectures. Primary focus is routing on a spin-wave crossbar, since the routing on the other two architectures is similar to the routing on the crossbar. Enhanced multiple multicasting features on the fully interconnected cluster is also described.

A. Parallel Routing and Broadcasting On A Spin-Wave Crossbar

A spin-wave crossbar according to embodiments of the present invention has several parallel and fault tolerant routing features. Below, the routing features of this architecture are described in three different scenarios. These techniques are then compared with those for the reconfigurable spin-wave architecture, and the fully connected spin-wave architecture described herein.

It is known to those of ordinary skill in the art that all crossbars are capable of realizing any arbitrary one-to-one permutation. In a standard VLSI crossbar however, unless there are broadcasting buses on each row, at any single point in time, only one switch is turned on in each row and each column. Spin-wave crossbars on the other hand support additional features such as broadcasting, and concurrent receiving as described below.

Figure 17:
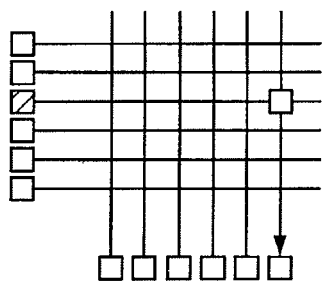
FIG. 17 is an exemplary illustration for practicing an aspect of an application according to an embodiment of the present invention.

Similar to any standard crossbar, a spin-wave crossbar realizes arbitrary permutations. As described previously herein, in the crossbar architecture signals are directed in each row and each column through spin-wave buses. As an example of a one-to-one permutation realization, assume that input 3 needs to send a message to output 6. In that case, the switch in row 3 and column 6, represented as s(3,6) should be set to on. In addition, the receiver's frequency of node 6 should be tuned to sender's frequency of node 3. The switches can be set to "on" according to the following mechanism: A fixed frequency is assigned to each column, and on top of each switch there is a receiver which is tuned to the frequency assigned to its column. As soon as the switch receives a signal on its frequency, it activates and routes the data. For instance, switch s(3,6) is tuned onto the frequency assigned to column 6, $f_6$. Input node 3 sends a signal on frequency $f_6$ on row 3, which turns on s(3,6). Now, the third row is connected to the sixth column, and permutation (3,6) is realized. FIG. 17 shows this communication on a crossbar of size 6. Note that there is a switch located on each of the grid points, but in FIG. 17 only the switch used is shown.

Figure 18:
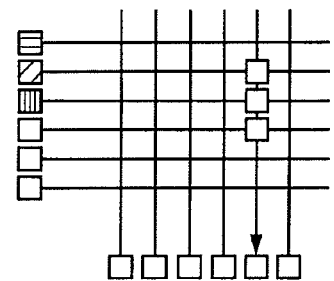
FIG. 18 is an exemplary illustration for practicing an aspect of an application according to an embodiment of the present invention.

Realizing a concurrent receive feature is very similar to realizing the one-to-one permutation as described above. A fixed frequency is assigned to each column (each receiver), and the senders tune their sending frequency to that frequency. As explained in the previous section, one of the important features of a spin-wave crossbar is allowing concurrent write. For instance node 2, 3 and 4 can all send a message to node 5, as shown in FIG. 18. Due to the superposition property of waves, as described in the previous sections, output 5 receives a signal which is the sum of these three waves. In a standard VLSI crossbar, it is not possible to perform these three communications simultaneously, because such a situation will cause a conflict on column 5.

Figure 19:
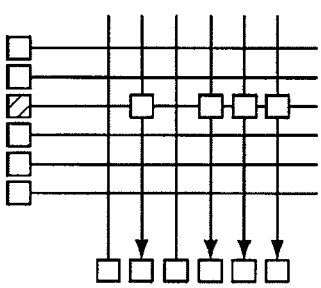
FIG. 19 is an exemplary illustration for practicing an aspect of an application according to an embodiment of the present invention.

Broadcasting at a node happens when that node sends a single message to multiple receivers. Realizing broadcasting in a spin-wave crossbar is slightly different from realizing concurrent receive. In this case, a fixed frequency is assigned to each row (each sender), and the receivers tune their receiving frequency to that. As explained earlier, one of the most important advantages of spin-wave crossbar is that one input can broadcast to multiple outputs simultaneously. For instance, node 3 can broadcast a message to output 2, 4, 5, and 6 at the same time, as shown in FIG. 19. The only constraint is that the receiver nodes should be tuned on the sender's frequency. Note that different senders can broadcast to different sets of inputs on different frequencies. However, since the receivers in different sets need to be tuned on different frequencies, the sets must be disjoint.

B. Parallel Routing and Broadcasting On A Spin-Wave Reconfigurable Mesh

The routing on a reconfigurable mesh is similar to a crossbar. However, this routing can be from any of the $N^2$ processing elements to any other one, so there can exist up to $N^2 \times N^2$ different routing schemes.

Figure 20:
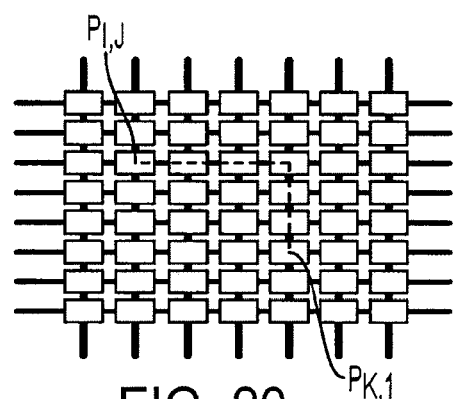
FIG. 20 is an exemplary illustration for practicing an aspect of an application according to an embodiment of the present invention.

The routing mechanism in a spin-wave reconfigurable mesh is as follows: To send information from $P_{i,j}$ to $P_{k,l}$, the sender, $P_{i,j}$ sends the signal to switch s(i,l) to be routed to $P_{k,l}$, as shown in FIG. 20. As described previously herein, the significance of spin-wave architectures is that multiple waves on different frequencies can pass through the same bus without any conflict. For instance $P_{3,2}$ can send a signal to $P_{6,5}$, while $P_{3,3}$ is sending a signal, on the same row and column, to $P_{5,5}$.

C. Parallel Routing and Broadcasting On A Spin-Wave Fully Interconnected Cluster The routing on a fully interconnected cluster is quite similar to the routing on a spin-wave crossbar, except that there is not switch on this architecture.

Similar to a crossbar, concurrent receive feature applies here as well. At a given frequency, a node can listen to multiple waves simultaneously. Using the superposition property of waves, it receives the sum of all waves destined to it. For instance, multiple senders send data to G at the same time, and G receives the sum of those signals. In this case, the requirement is that all the nodes should transmit at the same frequency that is also the frequency at which G's receiver is tuned.

Figure 21:
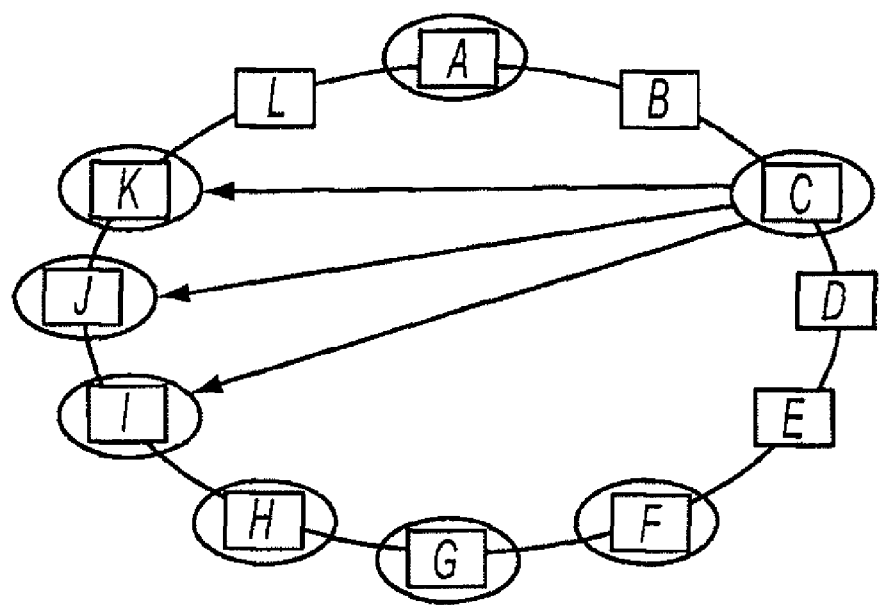
FIG. 21 is an exemplary illustration for practicing an aspect of an application according to an embodiment of the present invention.

Multiple broadcasting is possible here too. To distinguish the data being transmitted to different nodes, transmissions are done at distinct frequencies, using frequency division multiplexing. In a way, this is similar to having various radio stations, each broadcasting at a different frequency. To listen to a specific station, one tunes to the corresponding frequency. FIG. 21 shows an example, where node A is sending to a set of nodes, while C is sending to another set.

Note that since different senders broadcast to different sets on different frequencies, the sets must be disjoint. However, as pointed out earlier, the fully interconnected network has an additional feature that is different than the other two architecture. The feature allows multiple braodcasting to sets which are not disjoint. This is basically the combination of concurrent receive and multiple broadcasting.

Figure 22:
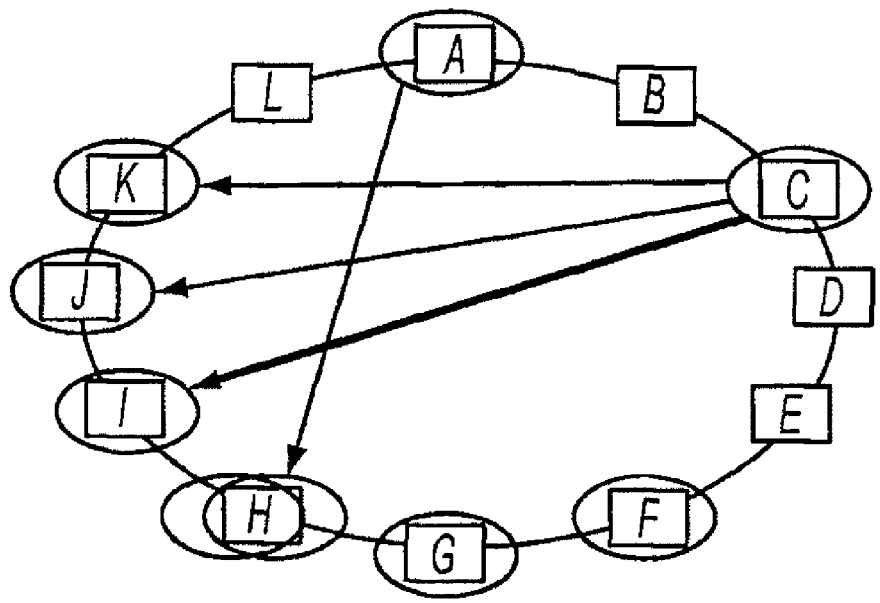
FIG. 22 is an exemplary illustration for practicing an aspect of an application according to an embodiment of the present invention.

Assume the scenario shown in the FIG. 22, where one of the A's and C's destinations is the same (node H). This requires the sending frequency of A and C to be the same as the receiving frequency of H. However, if the sending frequency of these two nodes are the same, the receiving frequency of K, J, G, and F has to be the same too, which causes each of these nodes to receive the superposition of the signals sent by A and C.

One approach to solve this problem is using phased array techniques, as are known to those f ordinary skill in the art, to direct the waves to specific locations. It is also possible to combine the phased array technique with multiple frequencies. This way, for each frequency, some of the waves are only transmitted to desirable directions and are received by the intended sources.

Advantages

Nano-scale computer architectures with a spin wave bus create considerable advantages. Interconnect problems are resolved because there are no physical wires for local interconnections and coupling is achieved via the common ferromagnetic spin wave bus. The coupling occurs via the magnetic field produced by the spin waves. Scalability beyond the conventional CMOS technology occurs because the size of the elementary logic circuit is limited only by the size of the I/O contacts, which are plentiful. These architectures are also compatible with CMOS fabrication. The layered structure of the novel devices can be easily realized with high accuracy by film deposition (MBE growth).

In addition, nano-scale computer architectures with a spin wave bus have an enhanced logic functionality, which provides a significant increase in the sphere of cells interactions. Each elementary circuit can be connected with a number of others in the network by spin waves. The sphere of interactions is limited by the spin wave attenuation length. Finally, these architectures have a defect tolerance. The operation is based on the spin wave excitation and spin wave superposition detection. The architectures are inherently tolerable to the imperfections where characteristic size is less than the spin wave coherence length $l_r$. In turn, the coherence length $l_r$ can be artificially controlled by the excitation in the wide range from tens of nanometers to microns.

New kinds of nano-scale computational architectures using spin waves as a physical mechanism for device interconnection are described. Information is encoded into the phase of spin waves propagating in a ferromagnetic film—spin wave bus. Using the invented device, several logic devices can be realized. Therefore, information transmission occurs without charge transfer. Architectures using the Spin Wave Bus can be beneficial in reducing power consumption and resolving adverse effects associated with conventional interconnects. In addition, the invented system provides the enhanced logic functionality. Phase logic facilitates realizing a number of logic functions in a single device. Together, these advantages make the nano-scale computer architectures with invented spin wave bus particularly useful in ultra-high-density integrated circuits (i. e., circuits with more than 1010 devices per square inch).

The particular embodiments disclosed above are illustrative only, as the invention can be modified and practiced in different, but equivalent, manners apparent to those skilled in the art having the benefit of the teachings herein. Furthermore, no limitations are intended to the details of construction or design herein shown. It is therefore evident that the particular embodiments disclosed above can be modified and all such variations are considered within the scope and spirit of the invention.

What is claimed is:

1. A solid-state spin-wave computing device comprising:
a plurality of inputs and a plurality of outputs, wherein said device is configured to simultaneously transmit data elements from each of said plurality of inputs to each of said plurality of outputs by using spin-waves of same or differing frequencies; and
an optical reconfigurable mesh (ORM) comprised of a processing layer and a deflection layer, said processing layer comprised of a plurality of modules and each said module having at least one processing element, said deflection layer comprised of a plurality of fixed mirrors and reconfigurable mirrors.

2. The solid-state spin-wave computing device of claim 1, wherein said solid-state spin-wave computing device is a crossbar.

3. The solid-state spin-wave computing device of claim 2, wherein said crossbar is further comprised of:
a plurality of spin-wave buses such that each said spin-wave bus is operatively connected with at least one of said plurality of inputs or one of said plurality of outputs; and
one or more spin-wave switches interposed between at least two of said spin-wave buses, wherein each said spin-wave switch is configured to be turned "on" to transmit spin-waves or to be turned "off" to reflect incoming spin-waves,
wherein said plurality of inputs is equal to "N" and said plurality of outputs is equal to "N" and said crossbar is configured to simultaneously transmit up to $O(N^2)$ data elements.

4. The solid-state spin-wave computing device of claim 3, each said module further having at least one crossbar,
wherein said ORM is configured to transmit data elements between modules through one or more of electrical routing, optical routing or electro-optical routing.

5. The solid-state spin-wave computing device of claim 2, each said module further having at least one crossbar,
wherein said ORM is configured to transmit data elements between modules through one or more of electrical routing, optical routing or electro-optical routing.

6. The solid-state spin-wave computing device of claim 1, wherein said solid-state spin-wave device is a nano-scale reconfigurable mesh.

7. The solid-state spin-wave computing device of claim 6, wherein said nano-scale reconfigurable mesh is further comprised of:
a plurality of spin-wave buses such that each said spin-wave bus is operatively connected with at least one of said plurality of inputs or one of said plurality of outputs, wherein spin-wave buses operatively connect to one or said plurality of inputs intersect with spin-wave buses operatively connected to one of said plurality of outputs to form a spin wave grid;
a plurality of processors operatively connected with said spin wave grid at each said intersection; and
one or more spin-wave switches interposed between at least two of said spin-wave buses at each of said processors, wherein each said spin-wave switch is configured to be locally-controlled by being turned "on" to transmit spin-waves or to be turned "off" to reflect incoming spin-waves such that said spin-wave grid is reconfigurable.

8. The solid-state spin-wave computing device of claim 7, each said module further having at least one nano-scale reconfigurable mesh,
wherein said ORM is configured to transmit data elements between modules through one or more of electrical routing, optical routing or electro-optical routing.

9. The solid-state spin-wave computing device of claim 6, each said module further having at least one nano-scale reconfigurable mesh,
wherein said ORM is configured to transmit data elements between modules through one or more of electrical routing, optical routing or electro-optical routing.

10. The solid-state spin-wave computing device of claim 1, wherein said solid-state spin-wave device is a fully-interconnected cluster.

11. The solid-state spin-wave computing device of claim 10, wherein said fully-interconnected cluster is further comprised of:
a plurality of nodes, wherein each said node is operatively connected with all other of said plurality of nodes through a magnetic layer such that all said nodes intercommunicate by spin waves through said magnetic layers,
wherein said fully-connected cluster is configured to simultaneously transmit said data elements from one or more of said nodes to one or more of said nodes through spin waves having same or different frequencies, said data elements coded into the frequency of the spin wave.

12. The solid-state spin-wave computing device of claim 11, wherein at least one of said plurality of nodes is further comprised of a receiver such that said at least one of said plurality of nodes only receives spin waves at a certain frequency or certain range of frequencies.

13. The solid-state spin-wave computing device of claim 11, wherein for a given spin wave frequency, data elements are transmitted from one of said plurality of nodes to one or more other of said plurality of nodes.

14. The solid-state spin-wave computing device of claim 11, wherein said plurality of nodes are comprised of said plurality of inputs and said plurality of outputs.

15. The solid-state spin-wave computing device of claim 11,
each said module further having at least one fully-interconnected cluster,
wherein said ORM is configured to transmit data elements between modules through one or more of electrical routing, optical routing or electro-optical routing.

16. The solid-state spin-wave computing device of claim 10,
each said module further having at least one fully-interconnected cluster, wherein said ORM is configured to transmit data elements between modules through one or more of electrical routing, optical routing or electro-optical routing.

17. The solid-state spin-wave computing device of claim 1, wherein at least one of said plurality of inputs is further comprised of a receiver such that said at least one of said plurality of outputs only receives spin waves at a certain frequency or certain range of frequencies.

18. The solid-state spin-wave computing device of claim 1, wherein for a given spin wave frequency, data elements are transmitted from one of said plurality of inputs to one or more other of said plurality of outputs.

19. A solid-state nano-scale fully-interconnected cluster comprising:
  a plurality of nodes, wherein each said node is operatively connected with all other of said plurality of nodes through a magnetic layer such that all said nodes intercommunicate data elements by spin waves through said magnetic layers; and
  an optical reconfigurable mesh (ORM) comprised of a processing layer and a deflection layer, said processing layer comprised of a plurality of modules and each said module having at least one processing element and fully-interconnected cluster, said deflection layer comprised of a plurality of fixed mirrors and reconfigurable minors;
  wherein said fully-interconnected cluster is configured to simultaneously transmit said data elements from one or more of said nodes to one or more of said nodes through spin waves having same or different frequencies, said data elements coded into the frequency of the spin wave.

20. The solid-state nano-scale fully-interconnected cluster of claim 19, wherein at least one of said plurality of nodes is further comprised of a receiver such that said at least one of said plurality of nodes only receives spin waves at a certain frequency or certain range of frequencies.

21. The solid-state nano-scale fully-interconnected cluster of claim 19, wherein for a given spin wave frequency, data elements are transmitted from one of said plurality of nodes to one or more other of said plurality of nodes.

22. The solid-state nano-scale fully-interconnected cluster of claim 19,
  wherein said ORM is configured to transmit data elements between modules through one or more of electrical routing, optical routing or electro-optical routing.

* * * * *